US011862967B2

(12) United States Patent
Peppas et al.

(10) Patent No.: US 11,862,967 B2
(45) Date of Patent: Jan. 2, 2024

(54) SURGE PROTECTIVE DEVICE ASSEMBLY MODULES

(71) Applicant: RAYCAP, S.A., Athens (GR)

(72) Inventors: George Peppas, Kalloni Troizinias (GR); Alex Chorozoglou, Drama (GR); Kostas Bakatsias, Athens (GR); Elias Fermelis, Koropi (GR); Zafiris G. Politis, St. Stefanos (GR)

(73) Assignee: RAYCAP, S.A., Athens (GR)

( * ) Notice: Subject to any disclaimer, the term of this patent is extended or adjusted under 35 U.S.C. 154(b) by 0 days.

(21) Appl. No.: 17/473,740

(22) Filed: Sep. 13, 2021

(65) Prior Publication Data

US 2023/0080367 A1 Mar. 16, 2023

(51) Int. Cl.
*H02H 9/04* (2006.01)
*H05K 5/00* (2006.01)
(Continued)

(52) U.S. Cl.
CPC ............ *H02H 9/042* (2013.01); *H02H 9/044* (2013.01); *H05K 5/0095* (2013.01); *H05K 5/0247* (2013.01); *H01C 7/12* (2013.01)

(58) Field of Classification Search
CPC .......... H02H 9/042; H02H 9/044; H02H 9/04; H02H 9/06; H05K 5/0095; H05K 5/0247; H01C 7/12; H01C 8/04
(Continued)

(56) References Cited

U.S. PATENT DOCUMENTS

| 1,144,029 A | 6/1915 | Creighton |
| 2,158,859 A | 5/1939 | Horikoshi |

(Continued)

FOREIGN PATENT DOCUMENTS

| CH | 466427 A | 12/1968 |
| CN | 106026067 A | 10/2016 |

(Continued)

OTHER PUBLICATIONS

Data Book Library 1997 Passive Components, Siemens Matsushita Components, pp. 15-17, 26-32, 36-37, 39, 161, 166, 167, 169, 171-174 (1997).
(Continued)

*Primary Examiner* — Danny Nguyen
(74) *Attorney, Agent, or Firm* — Myers Bigel, P.A.

(57) ABSTRACT

A surge protective device (SPD) assembly module includes a polymeric outer enclosure, an SPD module, a first terminal, and a second terminal. The polymeric outer enclosure defines an enclosed, environmentally sealed enclosure chamber. The SPD module is disposed in the enclosure chamber. The SPD module defines an environmentally sealed SPD chamber and includes: first and second electrically conductive electrode members; and a varistor member formed of a varistor material and electrically connected between the first and second electrode members. The varistor member is disposed in the SPD chamber between the first and second electrode members. The first terminal is electrically connected to the first electrode member and extending out from the outer enclosure. The second terminal is electrically connected to the second electrode member and extending out from the outer enclosure.

29 Claims, 18 Drawing Sheets

(51) Int. Cl.
*H05K 5/02* (2006.01)
*H01C 7/12* (2006.01)

(58) Field of Classification Search
USPC .................................................. 361/117–119
See application file for complete search history.

(56) References Cited

U.S. PATENT DOCUMENTS

| | | | |
|---|---|---|---|
| 2,311,758 | A | 2/1943 | Johansson |
| 2,805,294 | A | 9/1957 | William |
| 2,971,132 | A | 2/1961 | Nash |
| 3,249,719 | A | 5/1966 | Misare et al. |
| 3,375,405 | A | 3/1968 | Fallon et al. |
| 3,522,570 | A | 8/1970 | Wanaselja |
| 3,711,794 | A | 1/1973 | Tasca et al. |
| 3,743,996 | A | 7/1973 | Harnden |
| 3,813,577 | A | 5/1974 | Kawiecke |
| 4,015,228 | A | 3/1977 | Eda et al. |
| 4,023,133 | A | 5/1977 | Knapp, Jr. |
| 4,085,397 | A | 4/1978 | Yagher, Jr. |
| 4,089,032 | A | 5/1978 | Dell |
| 4,092,694 | A | 5/1978 | Stetson |
| 4,217,618 | A | 8/1980 | Kellenbenz et al. |
| 4,240,124 | A | 12/1980 | Westrom |
| 4,241,374 | A | 12/1980 | Gilberts |
| 4,249,224 | A | 2/1981 | Baumbach |
| 4,288,833 | A | 9/1981 | Howell |
| 4,355,345 | A | 10/1982 | Franchet |
| 4,425,017 | A | 1/1984 | Chan |
| 4,493,003 | A | 1/1985 | Mickelson et al. |
| 4,571,656 | A | 2/1986 | Ruckman |
| 4,595,635 | A | 6/1986 | Dubrow et al. |
| 4,600,261 | A | 7/1986 | Debbaut |
| 4,638,284 | A | 1/1987 | Levinson |
| 4,677,518 | A | 6/1987 | Hershfield |
| 4,701,574 | A | 10/1987 | Shimirak et al. |
| 4,906,963 | A | 3/1990 | Ackermann et al. |
| 4,908,730 | A | 3/1990 | Westrom |
| 4,956,696 | A | 9/1990 | Hoppe et al. |
| 5,006,950 | A | 4/1991 | Allina |
| 5,130,884 | A | 7/1992 | Allina |
| 5,172,296 | A | 12/1992 | Kaczmarek |
| 5,311,164 | A | 5/1994 | Ikeda et al. |
| 5,519,564 | A | 5/1996 | Carpenter |
| 5,523,916 | A | 6/1996 | Kaczmarek |
| 5,529,508 | A | 6/1996 | Chiotis et al. |
| 5,588,856 | A | 12/1996 | Collins et al. |
| 5,621,599 | A | 4/1997 | Larsen et al. |
| 5,652,690 | A | 7/1997 | Mansfield et al. |
| 5,721,664 | A | 2/1998 | Uken et al. |
| 5,724,221 | A | 3/1998 | Law |
| 5,745,322 | A | 4/1998 | Duffy et al. |
| 5,781,394 | A | 7/1998 | Lorenz et al. |
| 5,808,850 | A | 9/1998 | Carpenter |
| 5,812,047 | A | 9/1998 | Van |
| 5,936,824 | A | 8/1999 | Carpenter |
| 5,990,778 | A | 11/1999 | Struempler et al. |
| 6,038,119 | A | 3/2000 | Atkins et al. |
| 6,094,128 | A | 7/2000 | Bennett et al. |
| 6,172,865 | B1 | 1/2001 | Boy et al. |
| 6,175,480 | B1 | 1/2001 | Karmazyn |
| 6,222,433 | B1 | 4/2001 | Ramakrishnan et al. |
| 6,226,166 | B1 | 5/2001 | Gumley et al. |
| 6,327,129 | B1* | 12/2001 | Oertel ..................... H01T 1/14 361/120 |
| 6,430,019 | B1 | 8/2002 | Martenson et al. |
| 6,430,020 | B1 | 8/2002 | Atkins et al. |
| 6,459,559 | B1 | 10/2002 | Christofersen |
| 6,556,402 | B2 | 4/2003 | Kizis et al. |
| 6,614,640 | B2 | 9/2003 | Richter et al. |
| 6,840,432 | B1 | 1/2005 | Ramarge et al. |
| 6,930,871 | B2 | 8/2005 | Macanda |
| 7,433,169 | B2 | 10/2008 | Kamel et al. |
| 7,558,041 | B2 | 7/2009 | Lagnoux |
| 7,684,166 | B2 | 3/2010 | Donati et al. |
| 7,738,231 | B2 | 6/2010 | Lagnoux |
| 8,493,170 | B2 | 7/2013 | Zaeuner et al. |
| 8,659,866 | B2 | 2/2014 | Douglass et al. |
| 8,699,197 | B2 | 4/2014 | Douglass et al. |
| 8,743,525 | B2 | 6/2014 | Xepapas et al. |
| 9,349,548 | B2 | 5/2016 | Juricev |
| 9,355,763 | B2 | 5/2016 | Xu |
| 9,570,260 | B2 | 2/2017 | Yang et al. |
| 9,634,554 | B2 | 4/2017 | Falk et al. |
| 9,906,017 | B2 | 2/2018 | Tsovilis et al. |
| 10,447,026 | B2 | 10/2019 | Kostakis et al. |
| 2002/0018331 | A1 | 2/2002 | Takahashi |
| 2002/0024792 | A1 | 2/2002 | Cantagrel |
| 2002/0196593 | A1* | 12/2002 | Kizis ..................... H01C 7/12 361/91.1 |
| 2003/0184926 | A1 | 10/2003 | Wu et al. |
| 2004/0150937 | A1 | 8/2004 | Bobert et al. |
| 2005/0185356 | A1 | 8/2005 | Durth |
| 2005/0231872 | A1 | 10/2005 | Schimanski et al. |
| 2006/0034031 | A1 | 2/2006 | Lehuede |
| 2006/0245125 | A1 | 11/2006 | Aszmus |
| 2006/0291127 | A1 | 12/2006 | Kim et al. |
| 2007/0217106 | A1 | 9/2007 | Lagnoux |
| 2008/0043395 | A1 | 2/2008 | Donati et al. |
| 2008/0049370 | A1 | 2/2008 | Adachi et al. |
| 2009/0302992 | A1 | 12/2009 | Cernicka |
| 2011/0013330 | A1 | 1/2011 | Crevenat et al. |
| 2011/0193674 | A1 | 8/2011 | Zaeuner et al. |
| 2011/0248816 | A1 | 10/2011 | Duval et al. |
| 2012/0050935 | A1 | 3/2012 | Douglass et al. |
| 2012/0086539 | A1 | 4/2012 | Duval et al. |
| 2012/0086540 | A1 | 4/2012 | Duval et al. |
| 2012/0206848 | A1 | 8/2012 | Gillespie et al. |
| 2012/0250205 | A1 | 10/2012 | Pfitzer et al. |
| 2012/0268850 | A1 | 10/2012 | Rainer et al. |
| 2013/0038976 | A1 | 2/2013 | Hagerty |
| 2013/0200986 | A1 | 8/2013 | Koprivsek |
| 2013/0208387 | A1 | 8/2013 | Nguyen |
| 2013/0265685 | A1 | 10/2013 | Zauner et al. |
| 2013/0335869 | A1 | 12/2013 | Xepapas et al. |
| 2014/0010704 | A1 | 1/2014 | Ishida et al. |
| 2014/0092514 | A1 | 4/2014 | Chen |
| 2014/0292472 | A1 | 10/2014 | Qin et al. |
| 2014/0327990 | A1 | 11/2014 | Juricev |
| 2015/0014538 | A1 | 1/2015 | Holliday |
| 2015/0103462 | A1 | 4/2015 | Depping |
| 2015/0107972 | A1 | 4/2015 | Oh |
| 2015/0108899 | A1 | 4/2015 | Ramabhadran et al. |
| 2015/0270086 | A1 | 9/2015 | Chen |
| 2015/0280420 | A1 | 10/2015 | Mao |
| 2015/0349523 | A1 | 12/2015 | Tsovilis et al. |
| 2016/0087520 | A1 | 3/2016 | Falk et al. |
| 2016/0276821 | A1 | 9/2016 | Politis et al. |
| 2016/0329701 | A1 | 11/2016 | Bandel |
| 2017/0187180 | A1* | 6/2017 | Freer ..................... H02H 3/335 |
| 2017/0311462 | A1 | 10/2017 | Kamensek et al. |
| 2018/0138697 | A1 | 5/2018 | Crevenat et al. |
| 2018/0138698 | A1 | 5/2018 | Tsovilis et al. |
| 2018/0151318 | A1 | 5/2018 | Kamensek et al. |
| 2018/0183230 | A1 | 6/2018 | Kostakis et al. |
| 2018/0183232 | A1 | 6/2018 | Tavcar et al. |
| 2018/0330908 | A1 | 11/2018 | Vrhunc et al. |
| 2018/0341024 | A1 | 11/2018 | Shetty et al. |
| 2019/0080826 | A1 | 3/2019 | Kamensek et al. |
| 2019/0099132 | A1 | 4/2019 | Mulinti et al. |
| 2019/0160316 | A1* | 5/2019 | Counts ..................... A62C 37/08 |
| 2020/0036185 | A1 | 1/2020 | Tsovilis et al. |
| 2022/0360071 | A1* | 11/2022 | Zhang ..................... H02H 9/04 |

FOREIGN PATENT DOCUMENTS

| CN | 113363036 A | 9/2021 |
|---|---|---|
| DE | 1018953 B | 11/1957 |
| DE | 3111096 A1 | 9/1982 |
| DE | 3428258 A1 | 2/1986 |
| DE | 4235329 A1 | 4/1994 |
| DE | 69201021 T2 | 2/1995 |
| DE | 4438593 A1 | 5/1996 |
| DE | 19823446 A1 | 11/1999 |

(56) References Cited

FOREIGN PATENT DOCUMENTS

| | | |
|---|---|---|
| DE | 19839422 A1 | 3/2000 |
| DE | 19843519 A1 | 4/2000 |
| DE | 202004006227 U1 | 9/2004 |
| DE | 10323220 A1 | 12/2004 |
| DE | 102005048003 A1 | 4/2007 |
| DE | 102006003274 A1 | 7/2007 |
| DE | 202008004699 U1 | 6/2008 |
| DE | 102007014336 A1 | 10/2008 |
| DE | 102007030653 A1 | 2/2009 |
| DE | 102008017423 A1 | 10/2009 |
| DE | 102008026555 A1 | 12/2009 |
| DE | 102012004678 A1 | 9/2013 |
| DE | 202006021210 U1 | 9/2013 |
| DE | 102013103753 A1 | 10/2013 |
| DE | 102013011216 B3 | 10/2014 |
| DE | 102013107807 B3 | 1/2015 |
| DE | 102014016938 B3 | 2/2016 |
| DE | 102014016830 A1 | 3/2016 |
| EP | 0108518 A2 | 5/1984 |
| EP | 0203737 A2 | 12/1986 |
| EP | 0335479 A2 | 10/1989 |
| EP | 0445054 A1 | 9/1991 |
| EP | 0462694 A2 | 12/1991 |
| EP | 0516416 A1 | 12/1992 |
| EP | 0603428 A1 | 6/1994 |
| EP | 0785625 A2 | 7/1997 |
| EP | 0963590 A1 | 12/1999 |
| EP | 1094550 A2 | 4/2001 |
| EP | 1102371 A1 | 5/2001 |
| EP | 1116246 A1 | 7/2001 |
| EP | 1148530 A1 | 10/2001 |
| EP | 1355327 A2 | 10/2003 |
| EP | 1458072 A1 | 9/2004 |
| EP | 1798742 A1 | 6/2007 |
| EP | 2075811 A2 | 7/2009 |
| EP | 2201654 A1 | 6/2010 |
| EP | 2707892 A1 | 3/2014 |
| EP | 2725588 A1 | 4/2014 |
| EP | 102013021936 B3 | 2/2015 |
| EP | 2953142 A1 | 12/2015 |
| EP | 2954538 A1 | 12/2015 |
| EP | 3001525 A1 | 3/2016 |
| EP | 3240132 A1 | 11/2017 |
| EP | 3460938 A1 | 3/2019 |
| FR | 2574589 A1 | 6/1986 |
| FR | 2622047 A1 | 4/1989 |
| FR | 2897231 A1 | 8/2007 |
| JP | 60187002 | 9/1985 |
| JP | 60226103 | 11/1985 |
| JP | 60258905 | 12/1985 |
| JP | 61198701 | 9/1986 |
| JP | H01176687 | 7/1989 |
| JP | H05176445 A | 7/1993 |
| JP | H09326546 A | 12/1997 |
| JP | 2002525861 A | 8/2002 |
| JP | 2002525862 A | 8/2002 |
| SI | 9700277 A | 4/1999 |
| SI | 9700332 A | 6/1999 |
| SI | 20781 A | 6/2002 |
| SI | 20782 A | 6/2002 |
| SI | 22030 A | 10/2006 |
| SI | 23303 A | 8/2011 |
| SI | 23749 A | 11/2012 |
| SI | 24371 A | 11/2014 |
| WO | 8800603 A2 | 1/1988 |
| WO | 9005401 A1 | 5/1990 |
| WO | 9515600 A1 | 6/1995 |
| WO | 9524756 A1 | 9/1995 |
| WO | 9742693 A1 | 11/1997 |
| WO | 9838653 A1 | 9/1998 |
| WO | 0017892 A1 | 3/2000 |
| WO | 2007117163 A1 | 10/2007 |
| WO | 2008009507 A1 | 1/2008 |
| WO | 2008104824 A1 | 9/2008 |
| WO | 2011102811 A2 | 8/2011 |
| WO | 2012026888 A1 | 3/2012 |
| WO | 2012154134 A1 | 11/2012 |
| WO | 2013044961 A1 | 4/2013 |
| WO | 2016101776 A1 | 6/2016 |
| WO | 2016110360 A1 | 7/2016 |

OTHER PUBLICATIONS

DuPont 4300 Series Resistors Technical Data Sheet (3 pages) (May 2013).
Formex™ GK/Formex Product Data Flame Retardant Polypropylene Sheet, ITW Formex (4 pages) (2002).
Raycap "Rayvoss™ Transient Voltage Surge Suppression System" webpage, http://www.raycap.com/surge/rayvoss.htm accessed on Nov. 29, 2005 (1 page) (Date Unknown; Admitted Prior Art).
Raycap "Revolutionary Lightning Protection Technology" Raycap Corporation Press Release, webpage, http://www.raycap.com/news/020930.htm accessed on Nov. 29, 2005 (1 page) (Date Unknown; Admitted Prior Art).
Raycap "The Ultimate Overvoltage Protection: Rayvoss™" brochure (4 pages) (Date Unknown; Admitted Prior Art).
Raycap "Strikesorb® 30 Series OEM Surge Suppression Solutions" brochure (2 pages) (Apr. 17, 2009).
Raycap "The Next Generation Surge Protection Rayvoss™" brochure (4 pages) (May 4, 2012).
Raycap "The Ultimate Overvoltage Protection Rayvoss™" brochure (4 pages) (2005).
Raycap "The Ultimate Overvoltage Protection Rayvoss™" brochure (4 pages) (Jan. 2009).
Rayvoss™ "The Ultimate Overvoltage Protection" webpage, http://www.rayvoss.com accessed on Nov. 29, 2005 (2 pages) (Date Unknown; Admitted Prior Art).
Rayvoss™ "Applications" webpage http://www.rayvoss.com/applications.htm accessed on Nov. 29, 2005 (4 pages) (undated).
Rayvoss™ "Frequently Asked Questions" webpage, http://www.rayvoss.com/faq.htm accessed on Nov. 29, 2005 (2 pages) (Date Unknown; Admitted Prior Art).
Rayvoss™ "Technical Information" webpage, http://www.rayvoss.com/tech_info.htm accessed on Nov. 29, 2005 (3 pages) (Date Unknown; Admitted Prior Art).
Translation of DIN-Standards, Built-In Equipment for Electrical Installations; Overall Dimensions and Related Mounting Dimensions (15 pages) (Dec. 1988).
VAL-MS-T1/T2 335/12.5/3+1, Extract from the online catalog, Phoenix Contact GmbH & Co. KG, http://catalog.phoenixcontact.net/phoenix/treeViewClick.do?UID=2800184 (7 pages) (May 22, 2014).
Beitz et al. "Dubbel Taschenbuch für den Maschinenbau" (3 pages) (1997).
Oberg et al. "Machinery's Handbook 27th Edition—Soldering and Brazing" (4 pages) (2004).
Extended European Search Report corresponding to European Application No. 22194909.2 (6 pages) (dated Feb. 21, 2023).

* cited by examiner

SURGE PROTECTIVE DEVICE ASSEMBLY MODULES

FIELD OF THE INVENTION

The present invention relates to surge protective devices and, more particularly, to surge protective devices including varistors.

BACKGROUND OF THE INVENTION

Frequently, excessive voltage or current is applied across electrical power transmission lines that deliver power from electrical power generators (e.g., wind turbines and photovoltaic modules or stations) and/or to residences and commercial and institutional facilities. Such excess voltage or current spikes (transient overvoltages and surge currents) may result from lightning strikes, for example. Electronic equipment may be protected against transient overvoltages and surge currents using surge protective devices (SPDs).

SUMMARY

According to some embodiments, a surge protective device (SPD) assembly module includes a polymeric outer enclosure, an SPD module, a first terminal, and a second terminal. The polymeric outer enclosure defines an enclosed, environmentally sealed enclosure chamber. The SPD module is disposed in the enclosure chamber. The SPD module defines an environmentally sealed SPD chamber and includes: first and second electrically conductive electrode members; and a varistor member formed of a varistor material and electrically connected between the first and second electrode members. The varistor member is disposed in the SPD chamber between the first and second electrode members. The first terminal is electrically connected to the first electrode member and extending out from the outer enclosure. The second terminal is electrically connected to the second electrode member and extending out from the outer enclosure.

In some embodiments, the SPD module further includes a gas discharge tube (GDT) disposed in the SPD chamber and connected in electrical series with the varistor member between the first and second electrode members.

In some embodiments, one of the first and second electrode members is a housing electrode defining an SPD cavity, the SPD cavity forms at least a portion of the SPD chamber, and the other of the first and second electrode members is disposed in the SPD cavity.

The housing electrode may include a metal end wall and an integral metal sidewall collectively defining the SPD cavity.

According to some embodiments, the SPD module includes a biasing device applying an axially compressive load to the varistor member.

In some embodiments, the SPD assembly module includes an electrically conductive meltable member, and the meltable member is responsive to heat in the overvoltage protection device to melt and form an electrical short circuit path between the first and second electrode members.

The varistor member may comprise a varistor wafer.

According to some embodiments, the SPD assembly module includes a third terminal electrically connected to the second electrode member and extending out from the outer enclosure.

In some embodiments, the outer enclosure has opposed first and second sides, the second terminal projects outwardly from the first side of the outer enclosure, and the third terminal projects outwardly from the second side of the outer enclosure.

In some embodiments, the second terminal includes a first terminal structure rigidly mounted on the outer enclosure and projecting outwardly from the first side of the outer enclosure, and the third terminal includes a second terminal structure rigidly mounted on the outer enclosure and projecting outwardly from the second side of the outer enclosure.

According to some embodiments, the second terminal includes a first terminal structure connected to the outer enclosure by a flexible cable extending outwardly from the outer enclosure, and the third terminal includes a second terminal structure rigidly mounted on the outer enclosure and projecting outwardly from the outer enclosure.

According to some embodiments, the outer enclosure has opposed first and second sides, the second terminal projects outwardly from the first side of the outer enclosure, and the third terminal also projects outwardly from the first side of the outer enclosure.

According to some embodiments, the SPD assembly module includes a fourth terminal electrically connected to the second electrode member, wherein the fourth terminal includes a second terminal structure rigidly mounted on the outer enclosure and projecting outwardly from the second side of the outer enclosure.

According to some embodiments, at least one of the first and second terminals includes a terminal structure connected to the SPD module by a flexible cable extending outwardly from the outer enclosure.

In some embodiments, the flexible cable extends through an opening in the outer enclosure, and the SPD assembly module includes a heat shrink tube forming a seal between the flexible cable and the opening.

According to some embodiments, at least one of the first and second terminals includes a terminal structure rigidly mounted on the outer enclosure and projecting outwardly from the first side of the outer enclosure.

According to some embodiments, the outer enclosure fits snugly about the SPD module to inhibit or prevent relative movement between the SPD module and the outer enclosure.

According to some embodiments, the enclosed chamber is environmentally sealed in compliance with IP67 rating as per IEC 60529:1989+AMD1:1999+AMD2:2013.

In some embodiments, the outer enclosure includes first and second shells each defining a respective shell cavity, and the first and second shells are secured to one another and the respective shell cavities collectively form the enclosure chamber.

The SPD assembly module may include fasteners securing the first and second shells to one another.

In some embodiments, the outer enclosure includes fastener holes, and the SPD assembly module is configured to be mounted on a support using fasteners inserted through the fastener holes.

The SPD assembly module may include an adhesive for bonding the outer enclosure to a support.

The adhesive may include an adhesive selected from the group consisting of epoxy, and cyanoacrylate-based adhesive.

The outer enclosure may be configured to mount the SPD assembly module on a support in each of a first orientation and a second orientation inverted from the first orientation.

According to some embodiments, the SPD assembly module includes an integral electrical ground testing terminal electrically connected to the first electrode member, the electrical ground testing terminal is mounted in an opening in the outer enclosure and the opening is environmentally sealed, and the electrical ground testing terminal is accessible from external to the outer enclosure.

The SPD assembly module may include a cover over the electrical ground testing terminal, wherein the cover is selectively movable away from the electrical ground testing terminal to provide access to the electrical ground testing terminal.

The outer enclosure may be is formed of a material including a polymer selected from the group consisting of polysulphone (PSU), polyphenylsulphone (PPSU), and polyethersulphone (PESU).

According to method embodiments, a method for providing electrical surge protection includes providing a surge protective device (SPD) assembly module including a polymeric outer enclosure, an SPD module, a first terminal, and a second terminal. The polymeric outer enclosure defines an enclosed, environmentally sealed enclosure chamber. The SPD module is disposed in the enclosure chamber. The SPD module defines an environmentally sealed SPD chamber and includes: first and second electrically conductive electrode members; and a varistor member formed of a varistor material and electrically connected between the first and second electrode members; wherein the varistor member is disposed in the SPD chamber between the first and second electrode members. The first terminal electrically is connected to the first electrode member and extending out from the outer enclosure. The second terminal electrically is connected to the second electrode member and extending out from the outer enclosure. The method further includes securing the outer enclosure to a support.

According to some embodiments, one of the first and second electrode members is a housing electrode defining an SPD cavity, the SPD cavity forms at least a portion of the SPD chamber, and the other of the first and second electrode members is disposed in the SPD cavity.

The housing electrode may include a metal end wall and an integral metal sidewall collectively defining the SPD cavity.

Securing the outer enclosure to the support may include bonding the outer enclosure to the support with an adhesive.

Securing the outer enclosure to the support may include securing the outer enclosure to the support using fasteners inserted through fastener holes defined in the outer enclosure.

Further features, advantages and details of the present invention will be appreciated by those of ordinary skill in the art from a reading of the figures and the detailed description of the preferred embodiments that follow, such description being merely illustrative of the present invention.

BRIEF DESCRIPTION OF THE DRAWINGS

The accompanying drawings, which form a part of the specification, illustrate embodiments of the present invention.

DETAILED DESCRIPTION OF EMBODIMENTS OF THE INVENTION

Figure 1:
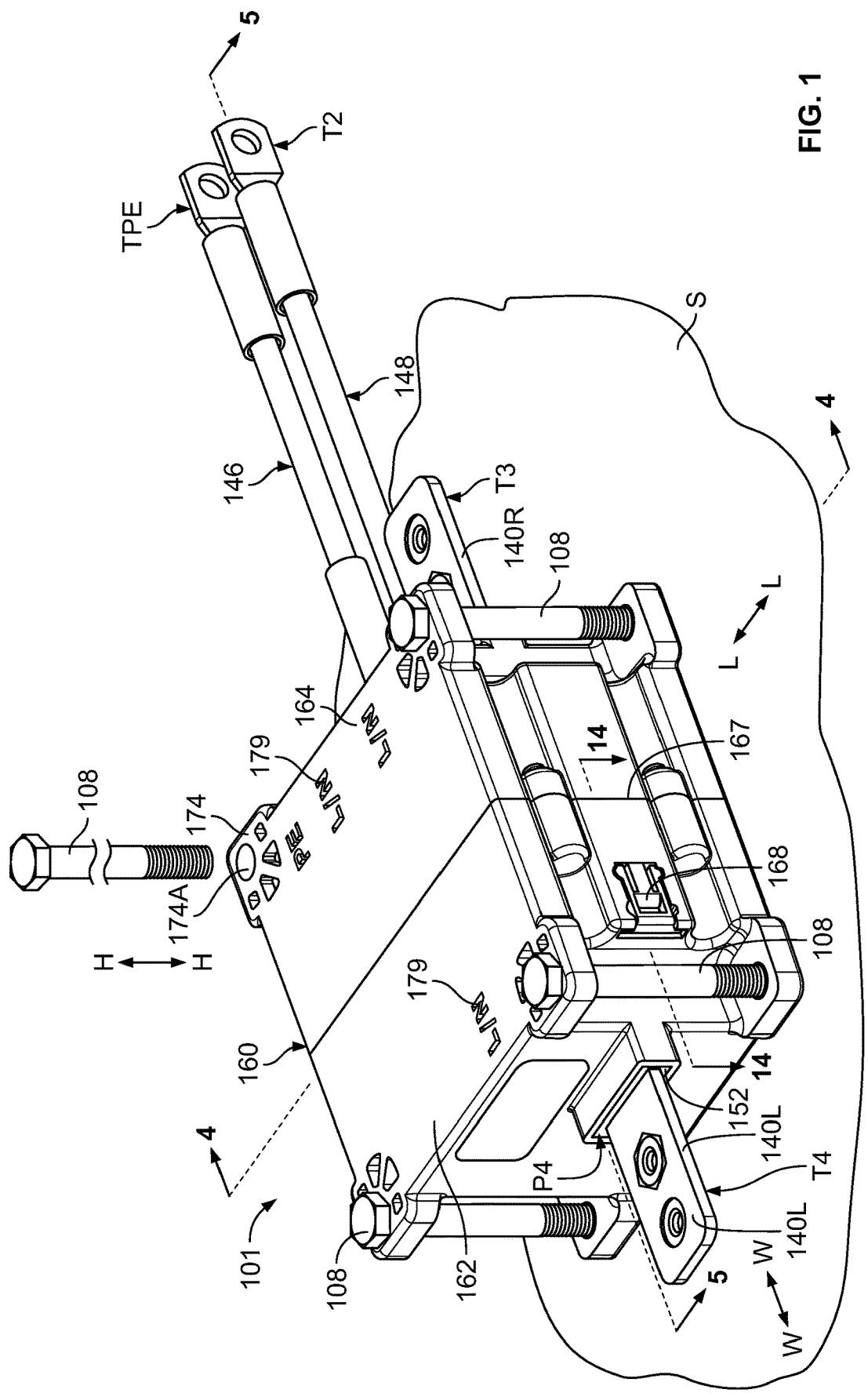
FIG. 1 is a top perspective view of an SPD assembly module according to some embodiments.

The present invention now will be described more fully hereinafter with reference to the accompanying drawings, in which illustrative embodiments of the invention are shown. In the drawings, the relative sizes of regions or features may be exaggerated for clarity. This invention may, however, be embodied in many different forms and should not be construed as limited to the embodiments set forth herein; rather, these embodiments are provided so that this disclosure will be thorough and complete, and will fully convey the scope of the invention to those skilled in the art.

It will be understood that when an element is referred to as being "coupled" or "connected" to another element, it can be directly coupled or connected to the other element or intervening elements may also be present. In contrast, when an element is referred to as being "directly coupled" or "directly connected" to another element, there are no intervening elements present. Like numbers refer to like elements throughout.

In addition, spatially relative terms, such as "under", "below", "lower", "over", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly.

Well-known functions or constructions may not be described in detail for brevity and/or clarity.

As used herein the expression "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, "monolithic" means an object that is a single, unitary piece formed or composed of a material without joints or seams. Alternatively, a unitary object can be a composition composed of multiple parts or components secured together at joints or seams.

As used herein, the term "wafer" means a substrate having a thickness which is relatively small compared to its diameter, length or width dimensions.

With reference to FIGS. 1-18, a modular overvoltage protection device or modular surge protective device (SPD) assembly module according to embodiments of the present invention is shown therein and designated 101.

Figure 18:
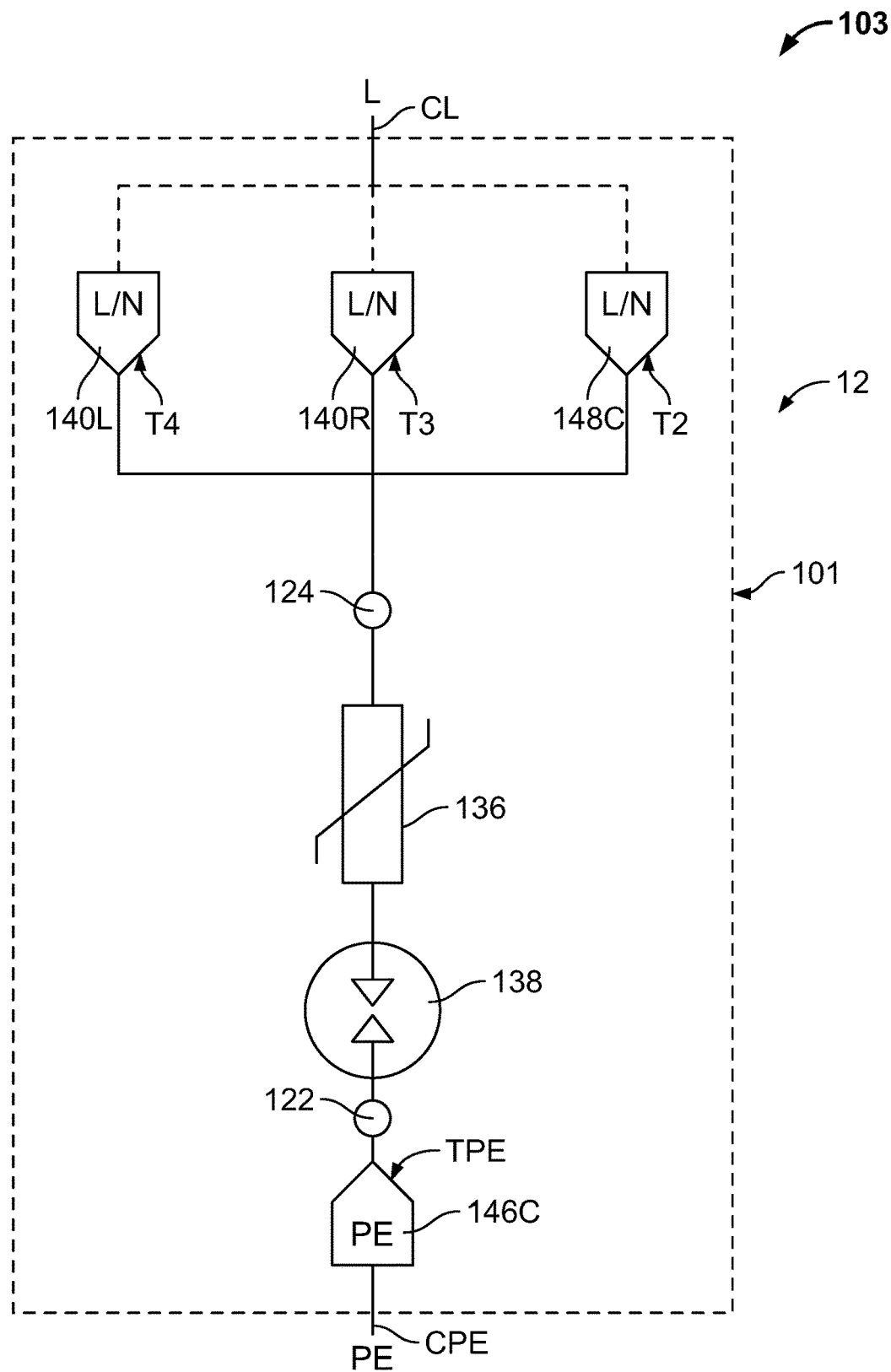
FIG. 18 is an electrical schematic of an electrical circuit including the SPD assembly module of FIG. 1 according to some embodiments of the inventive concept.

In accordance with some embodiments, the SPD assembly module 101 is configured be connected to, and in electrical series between, two electrical lines in order to provide overvoltage protection to one of the lines. In some embodiments or applications, the SPD assembly module 101 is connected to each of an electrical ground PE (e.g., protective earth ground) and a protected electrical line L as represented in FIG. 18. In some embodiments or applications, the line L is a voltage line of an electrical power circuit and, in some embodiments, is a voltage line of a multi-phase (e.g., three phase) electrical power circuit. In some embodiments or applications, the line L is a neutral line (N) of an electrical power circuit and, in some embodiments, is a neutral line of a multi-phase (e.g., three phase) electrical power circuit.

Figure 15:
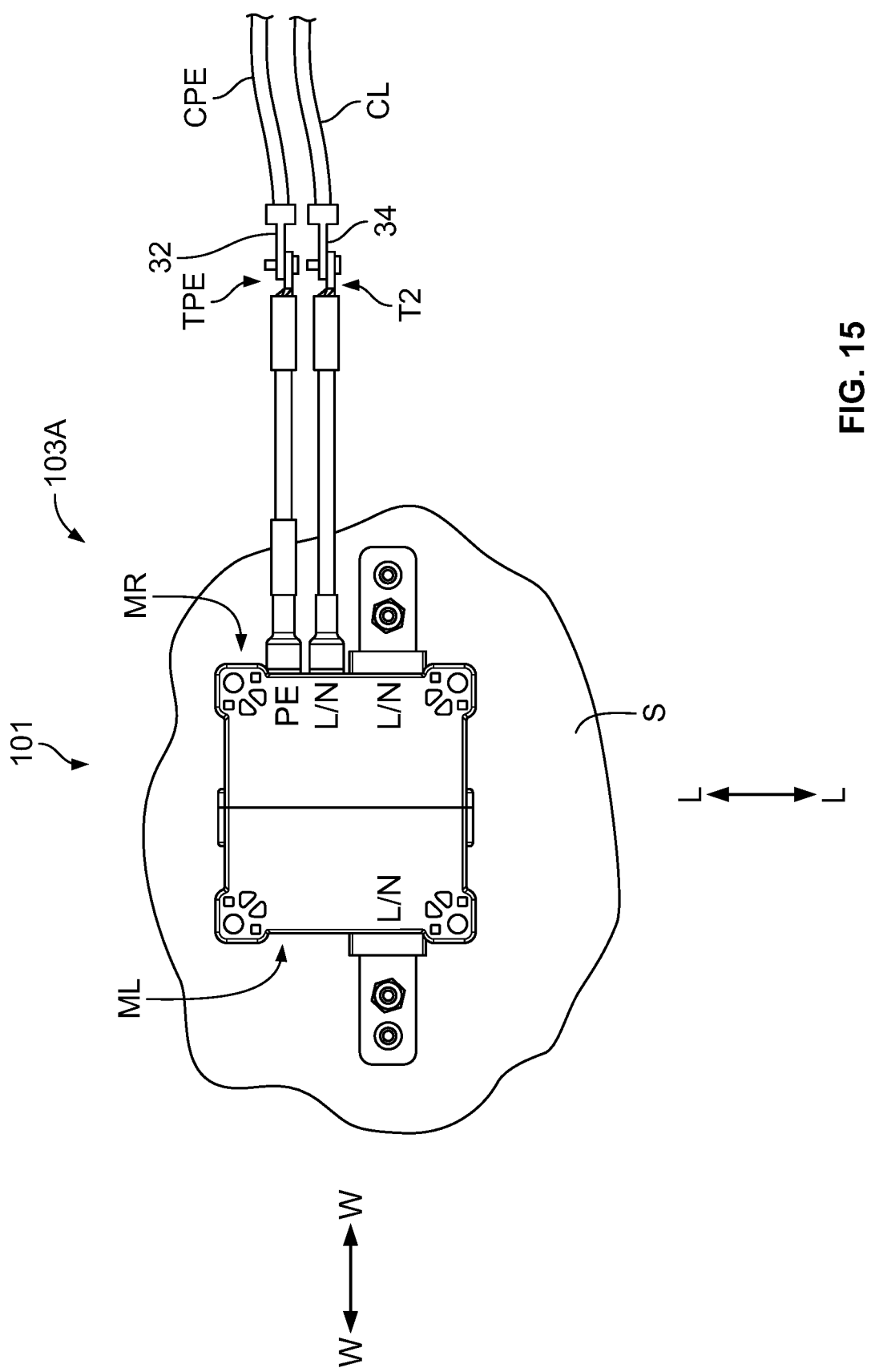
FIG. 15 is a top view of an SPD installation assembly including the SPD assembly module of FIG. 1 and having a first configuration.
Figure 16:
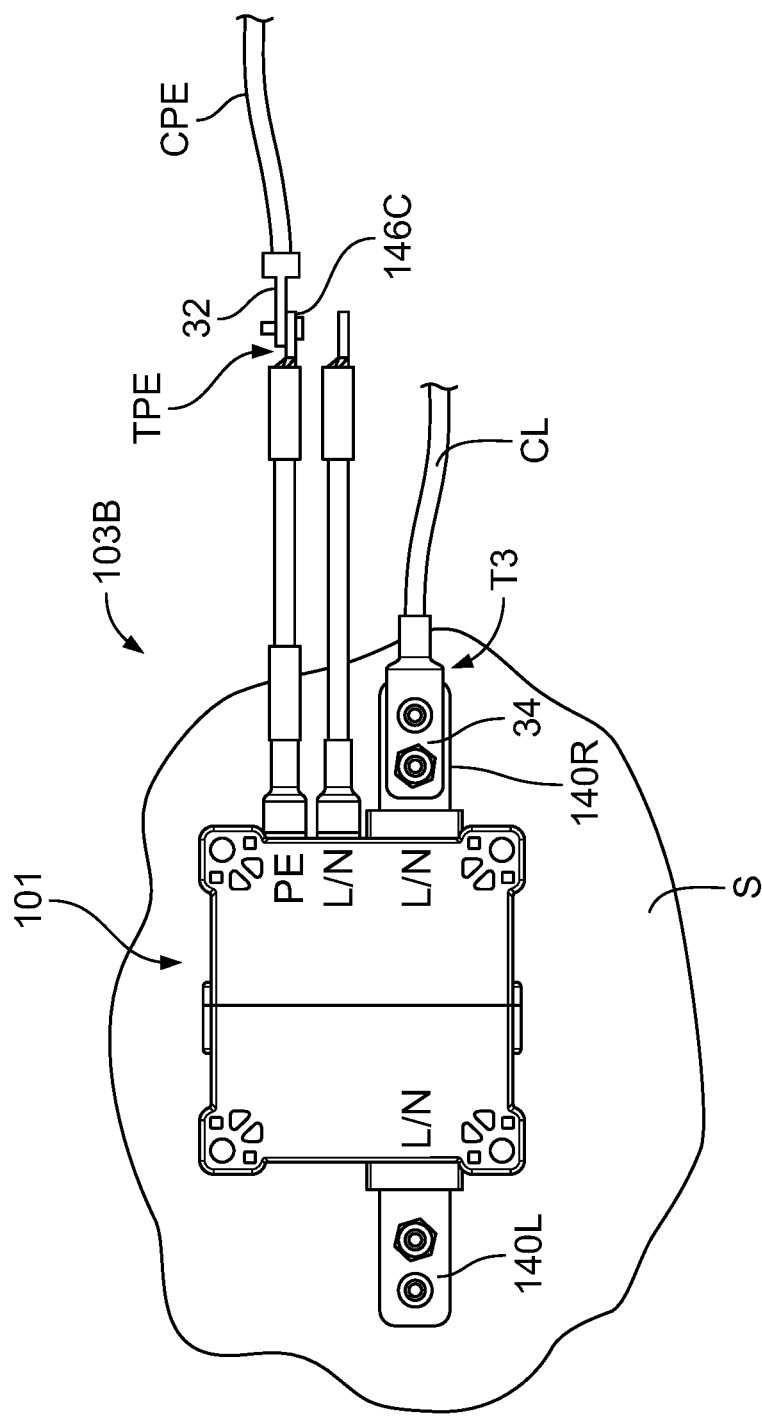
FIG. 16 is a top view of an SPD installation assembly including the SPD assembly module of FIG. 1 and having a second configuration.
Figure 17:
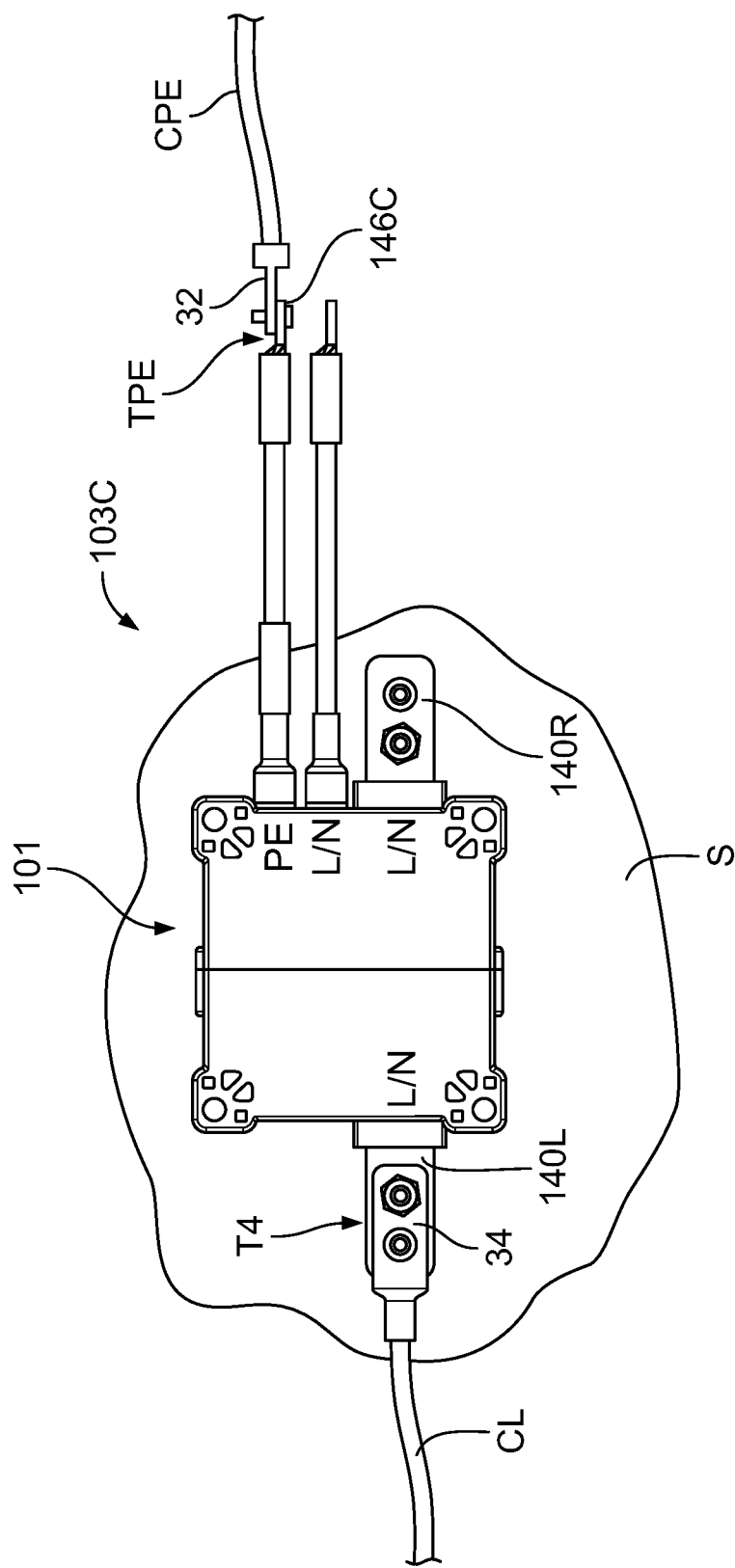
FIG. 17 is a top view of an SPD installation assembly including the SPD assembly module of FIG. 1 and having a third configuration.

The line L may be connected to the SPD assembly module 101 by a cable CL of the line L, and the protective earth PE may be connected to the SPD assembly module 101 by a cable CPE (FIGS. 15-17). The SPD assembly module 101 and the cables CL, CPE collectively form an SPD installation assembly 103A, 103B, or 103C when connected (FIGS. 15-17). As discussed herein, the SPD assembly module 101 includes an overvoltage protection circuit. The SPD assembly module 101 and the cables CL, CPE form an overvoltage protected circuit 12 (FIG. 18).

Figure 3:
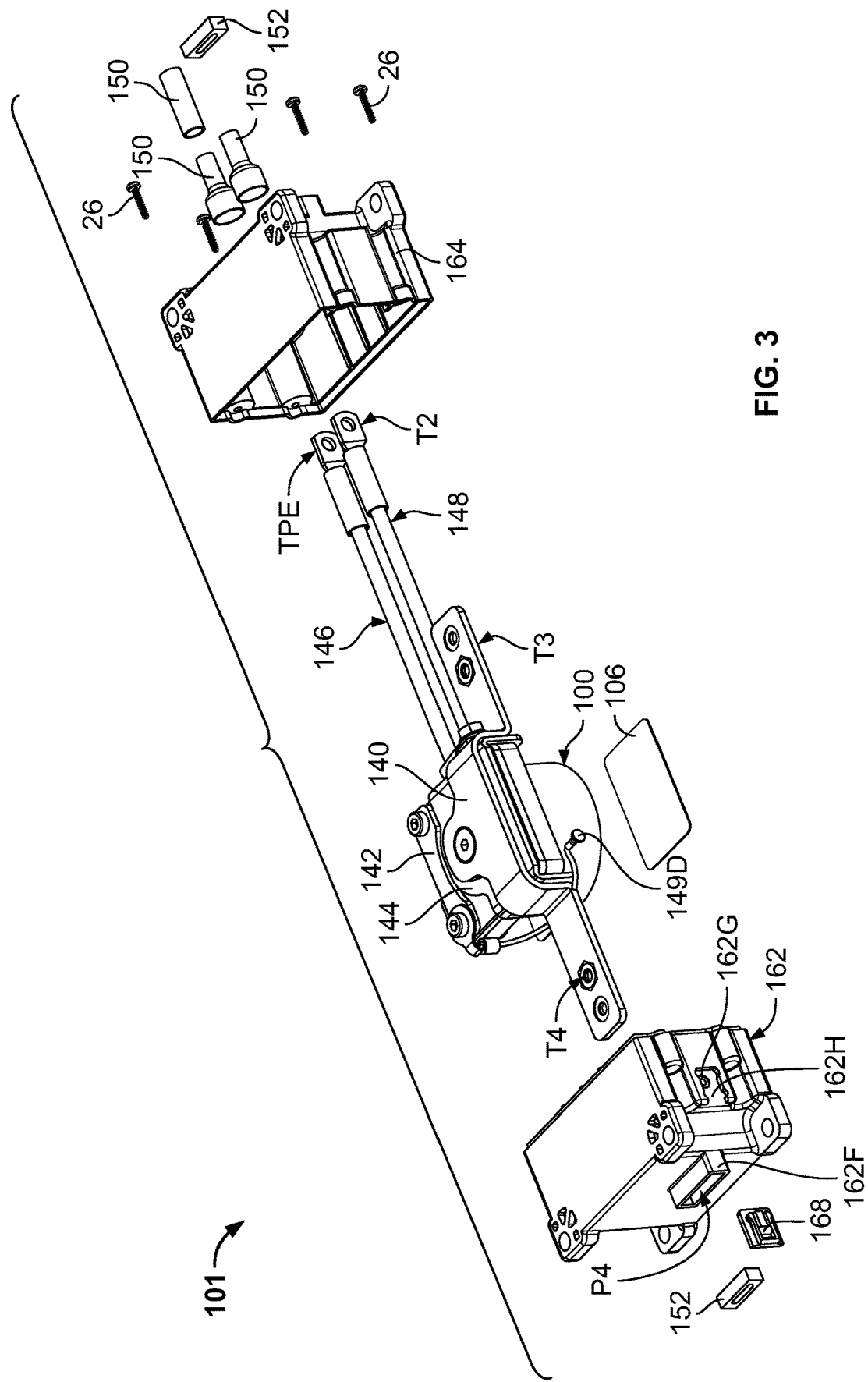
FIG. 3 is an exploded, top perspective view of the SPD assembly module of FIG. 1.
Figure 5:
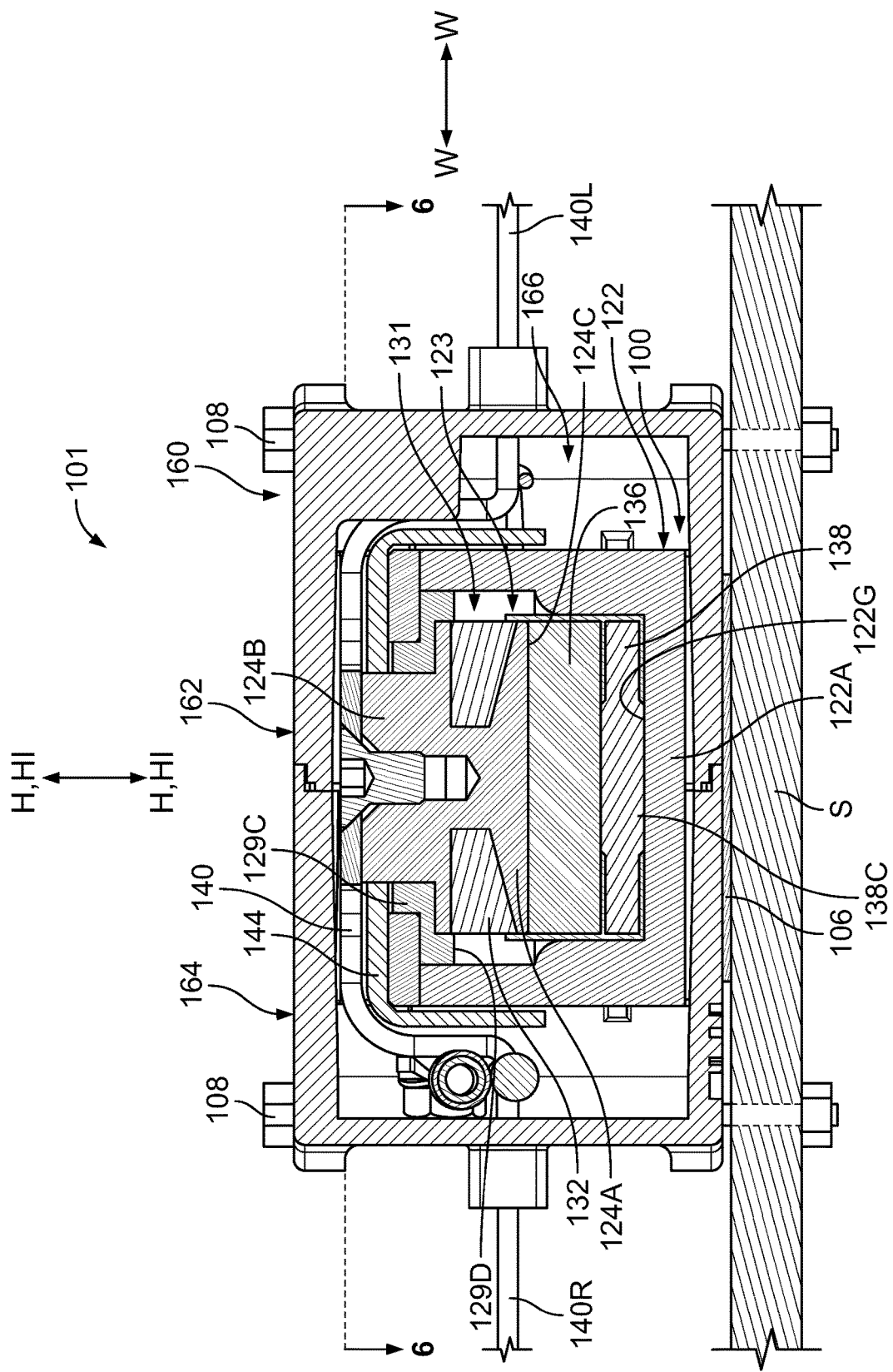
FIG. 5 is a cross-sectional view of the SPD assembly module of FIG. 1 taken along the line 5-5 of FIG. 1.

In accordance with some embodiments, the SPD assembly module 101 is configured to be mounted on and secured to a substrate or support S (FIGS. 1, 5 and 15-17). The support S may be any suitable support surface, structure or platform. Suitable supports S may include, for example, a wall or shelf of a cabinet, a wall, floor or other structure of a building, or a component of an electrical power generator or electrical power generation station. In some embodiments, the SPD assembly module 101 is secured to the support S using one or more fasteners 108 (FIGS. 1 and 5). In some embodiments, the SPD assembly module 101 is secured to the support S using an adhesive 106 (FIGS. 3 and 5). In some embodiments, the SPD assembly module 101 is secured to the support S using one or more fasteners 108 and an adhesive 106 (FIG. 5).

As discussed herein, the SPD assembly module 101 is configured to provide alternative options for connecting a conductor or cable CL of the line L to the SPD assembly module 101. The SPD assembly module 101 is configured to provide alternative options form affixing the SPD assembly module 101 to the support S. The SPD assembly module 101 is also configured to provide alternative options for orienting the SPD assembly module 101 on the support S.

The SPD assembly module 101 is configured as a unit or module having a heightwise axis H-H (FIG. 1), a lengthwise axis L-L perpendicular to the heightwise axis H-H, and a lateral or widthwise axis W-W perpendicular to the lengthwise axis L-L and perpendicular to the heightwise axis H-H.

The SPD assembly module 101 includes an outer enclosure 160, an SPD module 100 disposed and contained in the outer enclosure 160, a first electrical terminal TPE, a second electrical terminal T2, a third electrical terminal T3, and a fourth electrical terminal T4 (FIGS. 1 and 3).

The SPD assembly module 101 further includes a terminal busbar 140 (including the terminals T3 and T4), a terminal bracket 142, a first or PE cable assembly 146 (including the terminal TPE), a second or L/N cable assembly 148 (including the terminal T2), an insulator member 144, a ground testing terminal assembly 149, and a ground test cover 168.

The SPD module 100 (FIGS. 3-5 and 10-12) is configured as a unit or module having a heightwise axis HI-HI (FIG. 5) that is parallel to the axis H-H. The SPD module 100 includes a first electrode or housing electrode 122, a piston-shaped second or inner electrode 124, an end cover or cap 126, end cap fasteners (screws) 128, an elastomeric insulator member 129, a meltable member 132, an insulator sleeve 134, a varistor member 136, and a gas discharge tube (GDT) 138.

The SPD 100 may further include an integral fail-safe mechanism, arrangement, feature or system 131 (FIG. 5). The fail-safe system 131 is adapted to prevent or inhibit overheating or thermal runaway of the overvoltage protection device, as discussed in more detail below.

The housing electrode 122, the inner electrode 124, the end cap 126, the end cap screws 128, and the elastomeric insulator member 129 collectively form an SPD housing assembly 121 (FIG. 11) defining an environmentally sealed, enclosed SPD chamber 123 (FIG. 5). The varistor member 136 and the GDT 138 are disposed axially between the housing electrode 122 and the inner electrode 124 along the heightwise axis H-H, in the enclosed SPD chamber 123. The varistor member 136, the GDT 138, and the meltable member 132 are contained in the enclosed SPD chamber 123.

The housing electrode 122 (FIG. 12) has an end electrode wall 122A and an integral cylindrical sidewall 122B extending from the electrode wall 122A. The sidewall 122B and the electrode wall 122A form a chamber or cavity 122C communicating with an opening 122D. The electrode wall 122A has an inwardly facing, substantially planar contact surface 122G. Threaded screw holes 122H are defined in the upper end of the sidewall 122B.

According to some embodiments, the housing electrode 122 is formed of aluminum. However, any suitable electrically conductive metal may be used. According to some embodiments, the housing electrode 122 is unitary and, in some embodiments, monolithic. The housing electrode 122 as illustrated is cylindrically shaped, but may be shaped differently.

The inner electrode 124 (FIG. 12) has a head 124A disposed in the cavity 122C and an integral shaft 122B that projects outwardly through the opening 122D.

The head 124A has a substantially planar contact surface 124C that faces the contact surface 122G of the electrode wall 122A. A pair of integral, annular, axially spaced apart flanges 124D extend radially outwardly from the shaft 124B and define an annular, sidewardly opening groove 124E therebetween. A threaded bore 124F is formed in the end of the shaft 124B to receive a bolt for securing the electrode 124 to the terminal busbar 140.

According to some embodiments, the inner electrode 124 is formed of aluminum. However, any suitable electrically conductive metal may be used. According to some embodiments, the inner electrode 124 is unitary and, in some embodiments, monolithic.

An annular gap is defined radially between the head 124A and the nearest adjacent surface of the sidewall 122B. According to some embodiments, the gap has a radial width in the range of from about 1 to 15 mm.

The end cap 126 (FIG. 12) is substantially plate-shaped and has a profile matching that of the top end of the housing electrode 122. A shaft opening 126A and screw holes 126B are defined in the end cap 126.

According to some embodiments, the end cap 126 is formed of an electrically conductive material. In some embodiments, the end cap 126 is formed of a metal and, in some embodiments, are formed of aluminum.

The meltable member 132 is annular and is mounted on the inner electrode 124 in the groove 124E. The meltable member 132 is spaced apart from the sidewall 122B a distance sufficient to electrically isolate the meltable member 132 from the sidewall 122B.

The meltable member 132 is formed of a heat-meltable, electrically conductive material. According to some embodiments, the meltable member 132 is formed of metal. According to some embodiments, the meltable member 132 is formed of an electrically conductive metal alloy. According to some embodiments, the meltable member 132 is formed of a metal alloy from the group consisting of aluminum alloy, zinc alloy, and/or tin alloy. However, any suitable electrically conductive metal may be used.

According to some embodiments, the meltable member 132 is selected such that its melting point is greater than a prescribed maximum standard operating temperature. The maximum standard operating temperature may be the greatest temperature expected in the meltable member 132 during normal operation (including handling overvoltage surges within the designed for range of the system) but not during operation which, if left unchecked, would result in thermal runaway. According to some embodiments, the meltable member 132 is formed of a material having a melting point in the range of from about 80 to 160° C. and, according to some embodiments, in the range of from about 130 to 150° C. According to some embodiments, the melting point of the meltable member 132 is at least 20° C. less than the melting points of the housing electrode 122 and the inner electrode 124 and, according to some embodiments, at least 40° C. less than the melting points of those components.

According to some embodiments, the meltable member 132 has an electrical conductivity in the range of from about $0.5 \times 10^6$ Siemens/meter (S/m) to $4 \times 10^7$ S/m and, according to some embodiments, in the range of from about $1 \times 10^6$ S/m to $3 \times 10^6$ S/m.

According to some embodiments, the varistor member 136 is a varistor wafer (i.e., is wafer- or disk-shaped). In some embodiments, the varistor member 136 is circular in shape and has a substantially uniform thickness. However, the varistor member 136 may be formed in other shapes. The thickness and the diameter of the varistor member 136 will depend on the varistor characteristics desired for the particular application. In some embodiments, the SPD module 100 includes a plurality of the varistor members 136 axially stacked and captured between the inner electrode head 124A and the end wall 122A.

In some embodiments, the varistor member 136 has a diameter D1 to thickness T1 ratio of at least 3. In some embodiments, the thickness T1 (FIG. 12) of the varistor member 136 is in the range of from about 0.5 to 15 mm. In some embodiments, the diameter D1 (FIG. 12) of the varistor member 136 is in the range of from about 20 to 100 mm.

The varistor wafer 136 (FIG. 12) has first and second opposed, substantially planar contact surfaces 136U, 136L and a peripheral edge 136E.

The varistor material may be any suitable material conventionally used for varistors, namely, a material exhibiting a nonlinear resistance characteristic with applied voltage. Preferably, the resistance becomes very low when a prescribed voltage is exceeded. The varistor material may be a doped metal oxide or silicon carbide, for example. Suitable metal oxides include zinc oxide compounds.

The varistor wafer 136 may include a wafer of varistor material coated on either side with a conductive coating so that the exposed surfaces of the coatings serve as the contact surfaces 136U, 136L. The coatings can be metallization formed of aluminum, copper or silver, for example. Alternatively, the bare surfaces of the varistor material may serve as the contact surfaces 136U, 136L.

The GDT 138 is wafer or disk-shaped and includes a body 138A and opposed electrical terminals 138B and 138C on the major opposed faces of the body 138A, and an annular electrical insulator (e.g., ceramic) surrounding the body 138A between the terminals 138B, 138C. The body 138A contains an anode, a cathode and a spark gap chamber as is known in the art.

In some embodiments and as illustrated, the outer faces of the terminals 138B, 138C are substantially flat and planar or include a substantially flat or planar circular or annular contact region.

According to some embodiments, the ratio of the diameter of the GDT 138 to its thickness is in the range of from about 4 to 15. According to some embodiments, the thickness of the GDT 138 is in the range of from about 3 mm to 8 mm. In some embodiments, the diameter of the GDT 138 is in the range of from about 20 mm to 40 mm.

In some embodiments, the body 138A includes a hermetically or gas-tight sealed chamber or cell in which a selected gas is contained. The terminals 138B, 138C are electrically connected to the gas (e.g., by respective electrode portions in fluid contact with the contained gas). Below a prescribed spark over the voltage, the GDT 138 is electrically insulating between the terminals 138B, 138C. When an applied voltage across the terminals 138B, 138C exceeds the prescribed spark over voltage, the contained gas is ionized to cause electrical current to flow through the gas (by the Townsend discharge process) and thereby between the terminals 138B, 138C. Thus, the GDT 138 will selectively electrically insulate or conduct, depending on the applied voltage. The voltage required to initiate and sustain electrical conduction (discharge) will depend on the design characteristics of the GDT 138 (e.g., geometry, gas pressure, and gas composition).

In some embodiments, the GDT 138 has surge current and energy withstand capabilities at least as great as those of the MOV varistor wafer 136 (combined) used in series with the GDT 138.

Suitable GDTs may include a flat type GDT with rated voltage from 1000 to 2000 volts.

The insulator sleeve 134 is tubular and generally cylindrical. According to some embodiments, the insulator sleeve 134 is formed of a high temperature polymer and, in some embodiments, a high temperature thermoplastic. In some embodiments, the insulator sleeve 134 is formed of polyetherimide (PEI), such as ULTEM™ thermoplastic available from SABIC of Saudi Arabia. In some embodiments, the insulator member 134 is formed of non-reinforced polyetherimide.

According to some embodiments, the insulator sleeve 134 is formed of a material having a melting point greater than the melting point of the meltable member 132. According to some embodiments, the insulator sleeve 134 is formed of a material having a melting point in the range of from about 120 to 200° C.

According to some embodiments, the insulator sleeve 134 material can withstand a voltage of 25 kV per mm of thickness.

According to some embodiments, the insulator sleeve 134 has a thickness in the range of from about 0.1 to 2 mm.

The elastomeric insulator member 129 (FIGS. 5 and 12) is annular and includes a shaft opening 129A. The elastomeric insulator member 129 includes an annular main body 129B, an integral, annular upper flange 129C and an integral, annular lower flange 129D.

The elastomeric insulator member 129 is formed of an electrically insulating, resilient, elastomeric material. According to some embodiments, the elastomeric insulator member 129 is formed of a material having a hardness in the range of from about 60 Shore A to 85 Shore A. According to some embodiments, the elastomeric insulator member 129 is formed of rubber. According to some embodiments, the elastomeric insulator member 129 is formed of silicone rubber. Suitable materials for the elastomeric insulator member 129 may include silicone rubber having a Shore hardness 0-10 up to D-0 and, in some embodiments, Shore A 50 or Shore A 60.

The main body 129B of the elastomeric insulator member 129 is captured axially between the end cap 126 and the electrode upper flange 124D. The upper flange 129C extends through the end cap opening 126A and the shaft 124B of the electrode 124 extends through the opening 129A, so that the upper flange 129C fills the circumferential gap between the shaft 124B and the end cap 126. The lower flange 129D surrounds the electrode flange 124D so that the lower flange 129D fills the circumferential gap between the electrode flange 124D and the electrode sidewall 122B.

The insulator member 129 serves to electrically insulate the housing electrode 122 from the inner electrode 124. The compressed insulator member 129 can also form a seal to constrain or prevent overvoltage event byproducts, such as hot gases and fragments from the varistor wafers of the varistor member 136 from escaping the enclosed chamber 123 through the housing electrode opening 122D.

The main body 129B of the elastomeric insulator member 129 is captured between the end cap 126 and the electrode upper flange 124D and axially compressed (i.e., axially loaded and elastically deformed from its relaxed state) so that the insulator member 129 serves as a biasing member and applies a persistent axial pressure or load to the inner electrode 124 and the end cap 126. The elastomeric insulator member 129 thereby persistently biases or loads the electrode head 124A and the housing end wall 122A against the varistor member 136 and the GDT 138 along a load or clamping axis C-C (FIG. 12) in convergent directions to ensure firm and uniform engagement between the interfacing contact surfaces of the head 124A, the end wall 122A, the varistor member 136, and the GDT 138. This aspect of the SPD module 100 may be appreciated by considering a method according to the present invention for assembling the SPD module 100, as described below. In some embodiments, the clamping axis C-C is substantially coincident with the axis HI-HI.

The insulator sleeve 134 is slid into the housing cavity 122C.

The varistor member 136 and the GDT 138 are placed in the cavity 122C such that the terminal 138C of the GDT 138 the contact surface 122G of the end wall 122A, and engages the contact surface 136L of the varistor member 136 engages the terminal 138B of the GDT 138.

The head 124A is inserted into the cavity 122C such that the contact surface 124C engages the upper contact surface 136U of the varistor member 136.

The elastomeric insulator member 129 is slid over the shaft 124B. The end cap 126 is then slid over the shaft 124B and the elastomeric insulator member 129 and secured to the housing electrode 122 by the bolts 128. The end cap 126 axially compresses the elastomeric insulator member 129.

Figure 11:
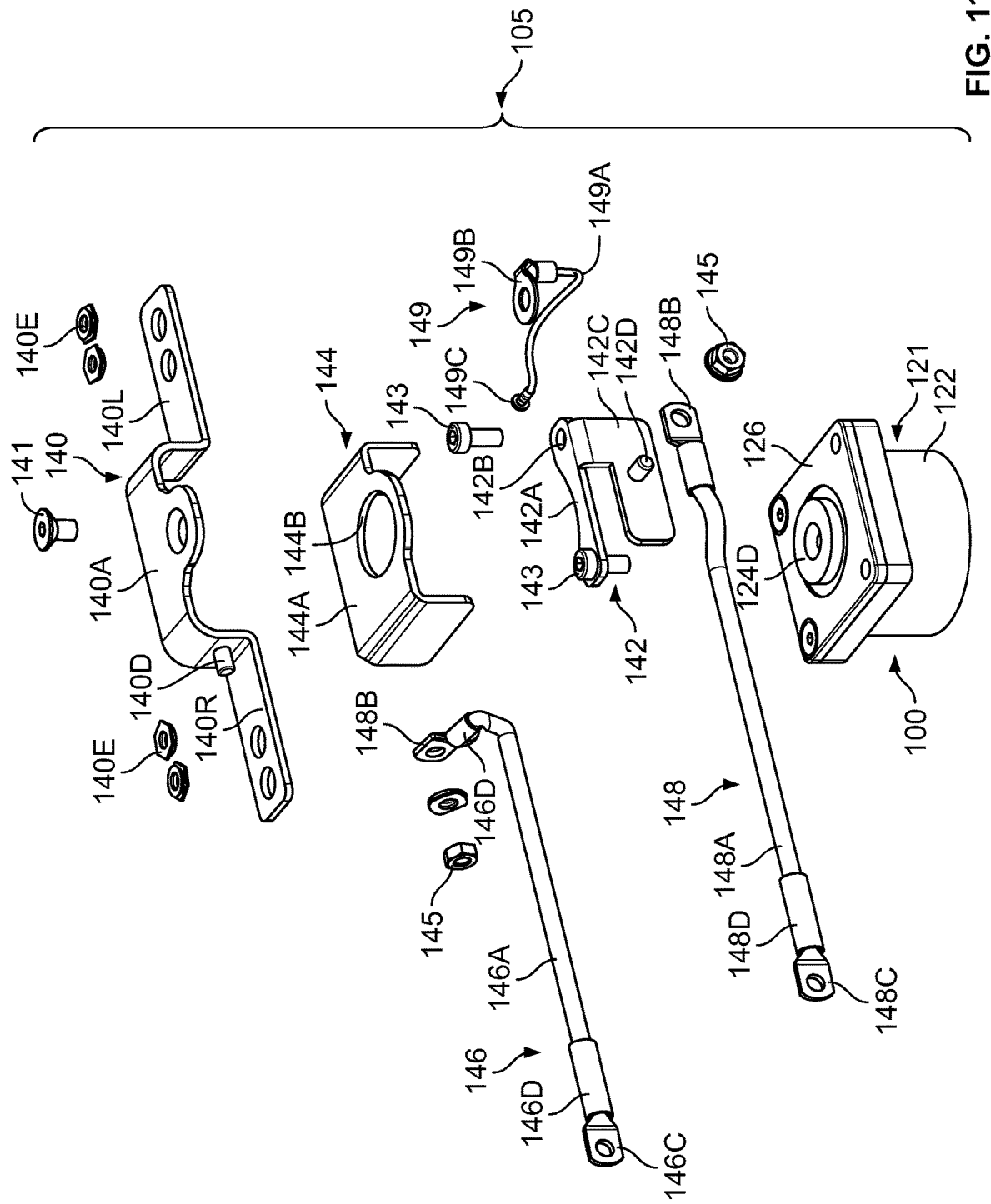
FIG. 11 is an exploded, top, perspective view of the electrical subassembly of FIG. 10.

With reference to FIG. 11, the L/N terminal busbar 140 includes a U-shaped body 140A, an integral first or left terminal structure 140L, and an integral second or right terminal structure 140R. The terminal structures 140L, 140R are tabs that are rigidly connected to the body 140A and project in opposing directions therefrom.

The body 140A is mechanically and electrically connected to the electrode 124 by a fastener 141. In some embodiments, the body 140A is secured in electrical contact with the electrode 124 by the fastener 141.

Mount holes 140C are provided in the terminal tabs 140L, 140R. The mount holes 140C may be threaded or provided with fixed nuts 140E. A threaded connection stud 140D is affixed to and projects from the body 140A.

The L/N terminal busbar 140 may be formed of any suitable electrically conductive metal. According to some embodiments, the L/N terminal busbar 140 is formed of aluminum. According to some embodiments, the L/N terminal busbar 140 is unitary and, in some embodiments, monolithic.

With reference to FIG. 11, the PE bracket 142 includes a body 142A and a leg 142C depending from the body 142A. Mount holes 142B are provided in the body 142A. A threaded connection stud 142D is affixed to and projects from the leg 142C.

The body 142A is mechanically and electrically connected to the housing electrode 122 by fasteners 143. In some embodiments, the body 140A is secured in electrical contact with the end cap 126 by the fasteners 143. The body 140A is thereby electrically connected to the housing electrode 122.

The PE bracket 142 may be formed of any suitable electrically conductive metal. According to some embodiments, the PE bracket 142 is formed of aluminum. According to some embodiments, the PE bracket 142 is unitary and, in some embodiments, monolithic.

With reference to FIG. 11, the busbar insulator member 144 includes a U-shaped body 144A and a hole 144B sized to receive the end of the electrode shaft 124B. The busbar insulator member 144 is interposed and clamped between the busbar 140 and the end cap 126. The busbar insulator member 144 thereby electrically insulates or isolates the busbar 140 from the housing electrode 122.

The busbar insulator member 144 may be formed of any suitable rigid, electrically insulating material. According to some embodiments, the busbar insulator member 144 is formed of polypropylene.

With reference to FIG. 11, the PE terminal assembly 146 includes a flexible, electrically insulated electrical cable 146A, an inner connector termination 146B and an outer connector termination 146C. The connector terminations 146B, 146C may be metal connector lugs. The outer connector termination 146C serves as a terminal structure for connecting the SPD module 100 to a PE line.

The ends of the insulation of the cable 146A are environmentally sealed about the connector terminations 146B, 146C by polymeric tubes 146D. In some embodiments, the end seals are water-tight.

Figure 13:
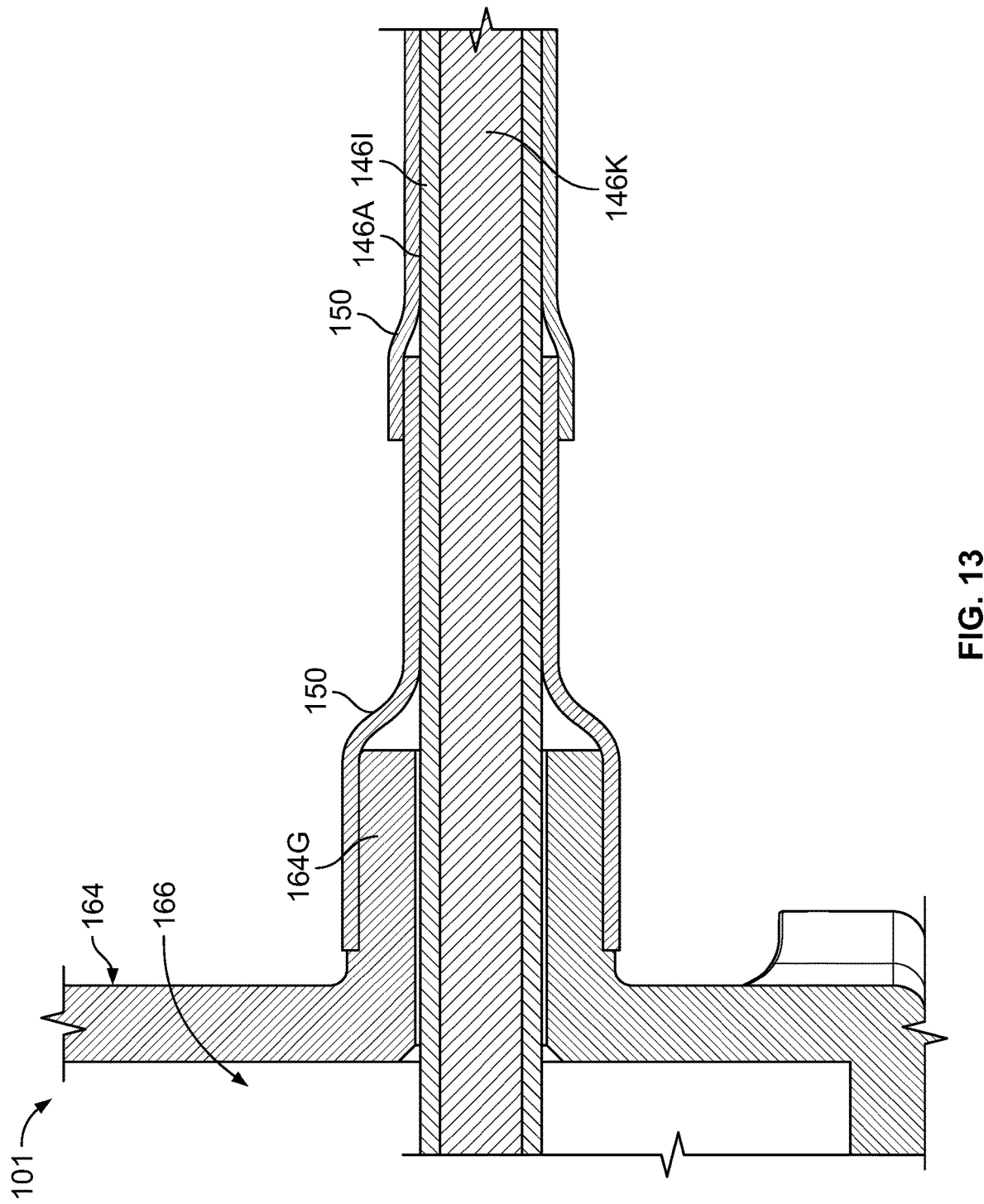
FIG. 13 is an enlarged, fragmentary, cross-sectional view of the SPD assembly module of FIG. 1 taken along the line 13-13 of FIG. 6.
Figure 14:
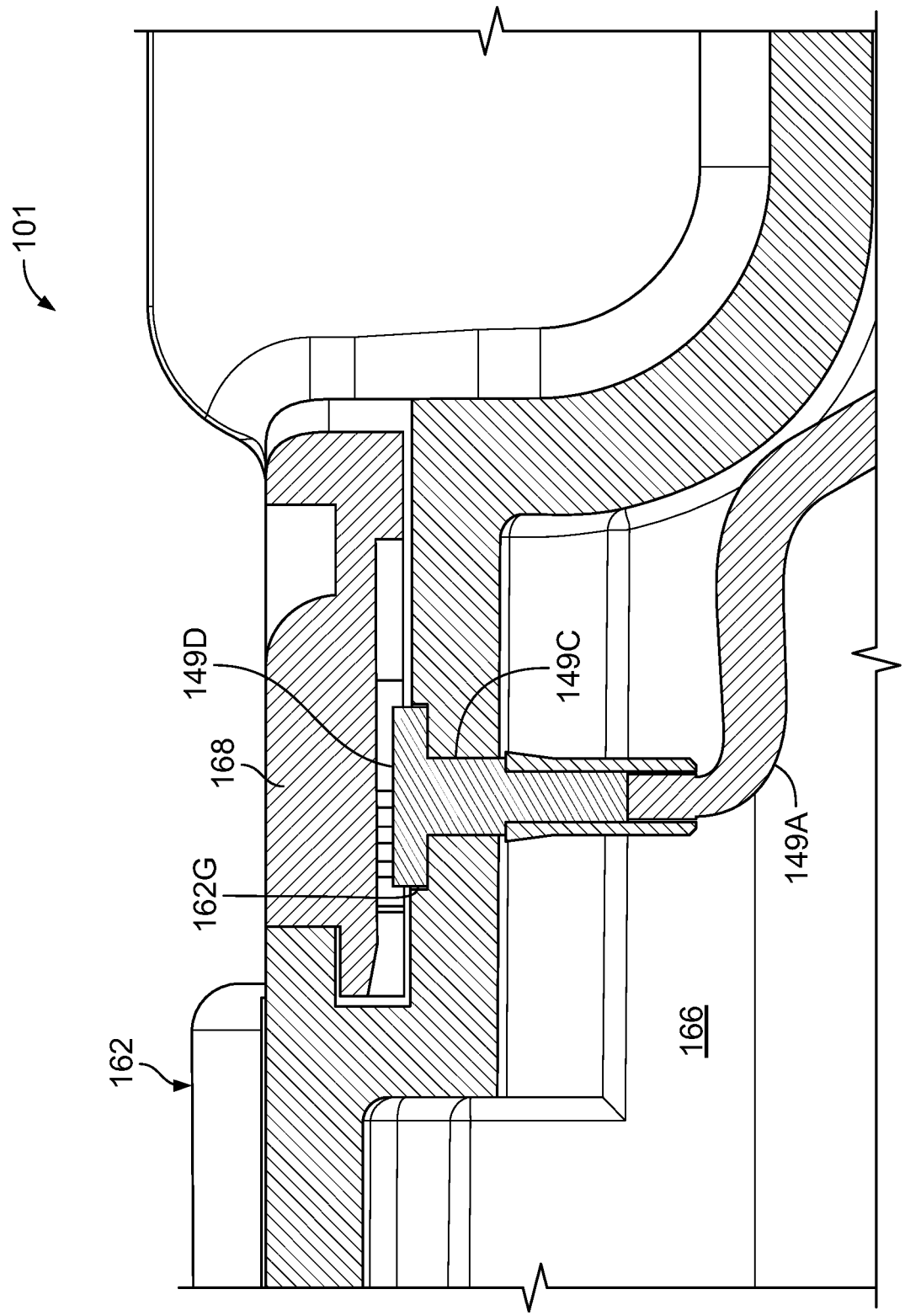
FIG. 14 is an enlarged, fragmentary, cross-sectional view of the SPD assembly module of FIG. 1 taken along the line 14-14 of FIG. 1.

The cable 146A may be an electrical cable of any suitable type or construction. As illustrated in FIG. 13, the cable 146A includes an electrical conductor 146K surrounded by a tubular polymeric insulation layer 146I. Suitable cables may include silicone rubber-insulated cables, PTFE-insulated cables, cross-linked polyolefic-copolymer-insulated cables, ethylene tetraflouroethylene (ETFE) insulated cables, cross-linked ETFE-insulated cables, and polyimide-insulated cables.

The tubes 146D may be formed of any suitable material. In some embodiments, the tubes 146D are formed of an electrically insulating polymeric material. In some embodiments, the tubes 146D are formed of an electrically insulating elastomeric material. In some embodiments, the tubes 146D are formed of an electrically insulating heat shrinkable polymer (e.g., elastomer) that has been heat shrunk about the corresponding cable insulation and connector termination. In other embodiments, the tubes 146D are cold shrinkable elastomeric tubes. In other embodiments, a sealant or gasket may be used in place of or in addition to the sealing tubes 146D.

The connector termination 146B is electrically and mechanically connected to the PE bracket 142 by the stud 142D and a nut 145. The outer connector termination 146C is thereby electrically connected to the electrode housing 122.

With reference to FIG. 11, the L/N terminal assembly 148 includes a flexible, electrically insulated electrical cable 148A, an inner connector termination 148B and an outer connector termination 148C. The connector terminations 148B, 148C may be metal connector lugs. The outer connector termination 148C serves as a terminal structure for connecting the SPD module 100 to a line L or a neutral line N.

The ends of the insulation of the cable 148 are environmentally sealed about the connector terminations 148B, 148C by polymeric tubes 148D. In some embodiments, the end seals are water-tight. The L/N terminal assembly 148 may be constructed in the same manner as described above for the PE terminal assembly 146.

The connector termination 148B is electrically and mechanically connected to the L/N terminal busbar 140 by the stud 140D and a nut 145. The outer connector termination 148C is thereby electrically connected to the inner electrode 124.

With reference to FIG. 11, the ground testing terminal assembly 149 includes an electrically insulated electrical wire 149A, an inner connector termination 149B (e.g., a lug connector), and a contact termination 149C. The contact termination 149C has a contact surface or face 149D.

The connector termination 149B is electrically and mechanically connected to the PE bracket 142 by a fastener 143. The contact termination 149C is thereby electrically connected (via the wire 149A) to the electrode housing 122.

Figure 4:
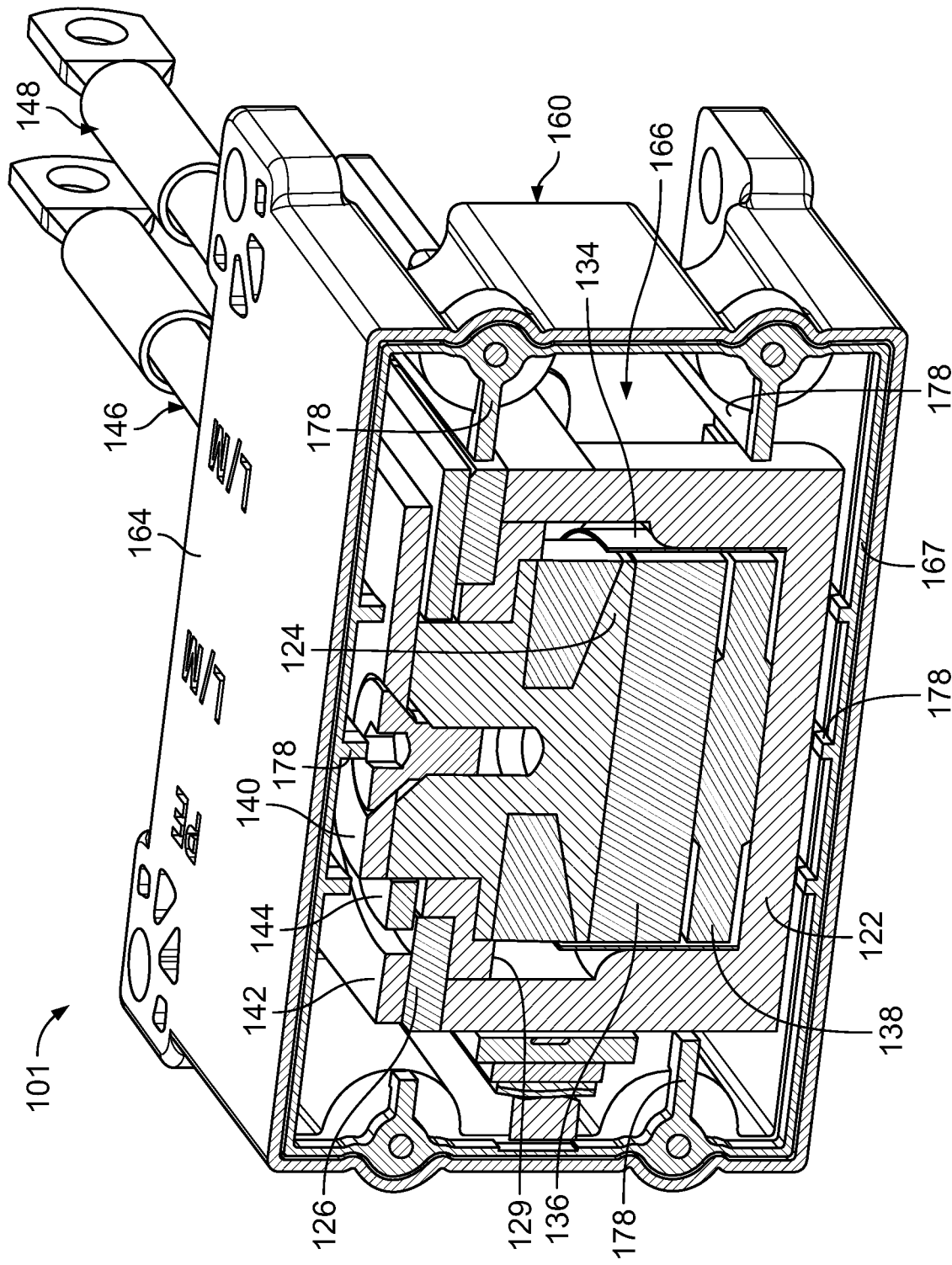
FIG. 4 is a cross-sectional view of the SPD assembly module of FIG. 1 taken along the line 4-4 of FIG. 1.

With reference to FIGS. 1-9, 13 and 14, the enclosure 160 includes a first or left shell 162, a second or right shell 164, coupling screws 26, and a test cover 168. The shells 162, 164 are mated at an environmentally sealed interface 167. The shells 162, 164 collectively form an environmentally sealed enclosure chamber 166 (FIG. 4). In some embodiments, the chamber 166 is sealed water-tight.

The shell 162 (FIG. 7) defines a cavity 162A and an opening 162B. The shell 164 (FIGS. 8 and 9) defines a cavity 164A and an opening 164B. Each shell 162, 164 includes a top wall 172A, a bottom wall 172B, and opposed end walls 172C, 172D. The shell 162 further includes a first or left side wall 172E. The shell 164 further includes a second or right side wall 172F.

Each shell 162, 164 includes integral mount tabs 174 at its top and bottom and front and rear corners. A pair of vertically stacked and aligned, spaced apart tabs 174 are thereby provided at each corner of the enclosure. Each mount tab 174 includes a mount hole 174A.

Each shell 162, 164 includes integral locator features 178 protruding into their cavities 162A, 164A. The locator features 178 may take any suitable forms, including elongate ribs as illustrated.

Screw mounts 175 are defined in each shell 162, 164 to receive the screws 26 to clamp the shells 162, 164 together.

The shell 162 includes a circumferential end flange 162C that is received in a circumferential end groove 164C of the shell 164 to help form the environmental seal. In some embodiments, the flange 162C fits snugly or with an interference fit in the groove 164C.

The left shell 162 (FIG. 7) includes a termination tab opening P4 surrounded by an annular flange 162F (FIG. 3).

The left shell 162 also includes a test port 162G (FIGS. 3 and 14) in which the contact termination 149C is mounted such that the contact surface 149D is exposed outside the shell 162. The interface between the contact termination 149C and the test port 162G is sealed such that the test port 162G is sealed fluid or water tight. For example, the contact termination 149C may be secured in the test port 162G with adhesive and/or an interference fit. The test cover 168 is mounted on the shell 162 to be displaceable relative to the shell 162 such that it can be selectively moved to expose the contact surface 149D. In some embodiments, the test cover 168 is slidably mounted in a test cover slot 162H (FIG. 3) of the shell 162.

The right shell 164 (FIGS. 8 and 9) includes a termination tab opening P3 surrounded by a flange 164F, a PE cable opening PPE surrounded by an annular flange 164G, and an L/N cable opening P2 surrounded by an annular flange 164H.

The shells 162, 164 may be formed of any suitable material(s). In some embodiments, the shells 162, 164 are formed of an electrically insulating material. In some embodiments, the shells 162, 164 are formed of a polymeric material. The material of the shelles 162, 164 may be selected from the group consisting of polysulphone (PSU), polyethersulphone (PESU), and polyphenylsulphone (PPSU) (e.g., with 5-15% fiber glass or without fiber glass addition). In some embodiments, the shells 162, 164 are formed of a flame retardant polymeric material. In some embodiments, the shells 162, 164 are formed of a polymeric material having a temperature resistance of at least 100 degrees Celsius.

The test cover 168 may be formed of the same material as described for the shells 162, 164, or another electrically insulating material.

Indicia 179 is provided on the enclosure 160 to indicate (e.g., for an installer) the purpose of each corresponding terminal TPE, T2, T3, T4. The indicia 179 may be embossed, printed or otherwise provided on the enclosure 160.

The SPD module 100, the terminal busbar 140, the terminal bracket 142, the PE cable assembly 146, the L/N cable assembly 148, the insulator member 144, the ground testing terminal assembly 149, and the associated fasteners form an electrical subassembly 105. The electrical subassembly 105 is disposed in the enclosure housing 160 such that the SPD module 100 is contained in the enclosure chamber 166 and the terminal tabs 140L, 140R, the PE cable assembly 146, and the L/N cable assembly 148 extend out of the enclosure 160 through the openings PPE, P2, P3, P4. More particularly, the terminal tab 140L extends through the opening P3, the terminal tab 140R extends through the opening P4, the PE cable assembly 146 extends through the opening PPE, and the L/N cable assembly 148 extends through the opening P2.

Figure 2:
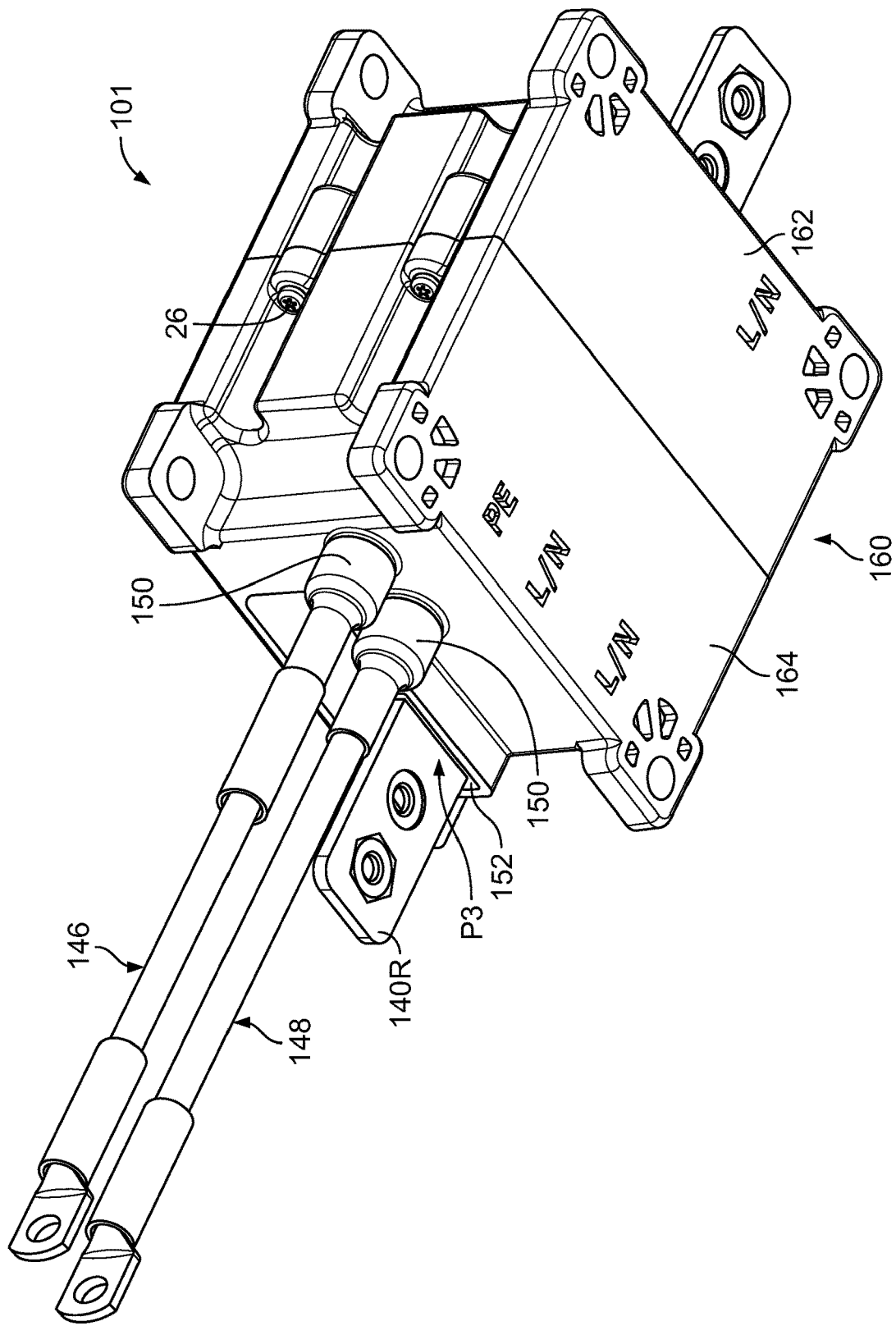
FIG. 2 is a bottom perspective view of the SPD assembly module of FIG. 1.
Figure 9:
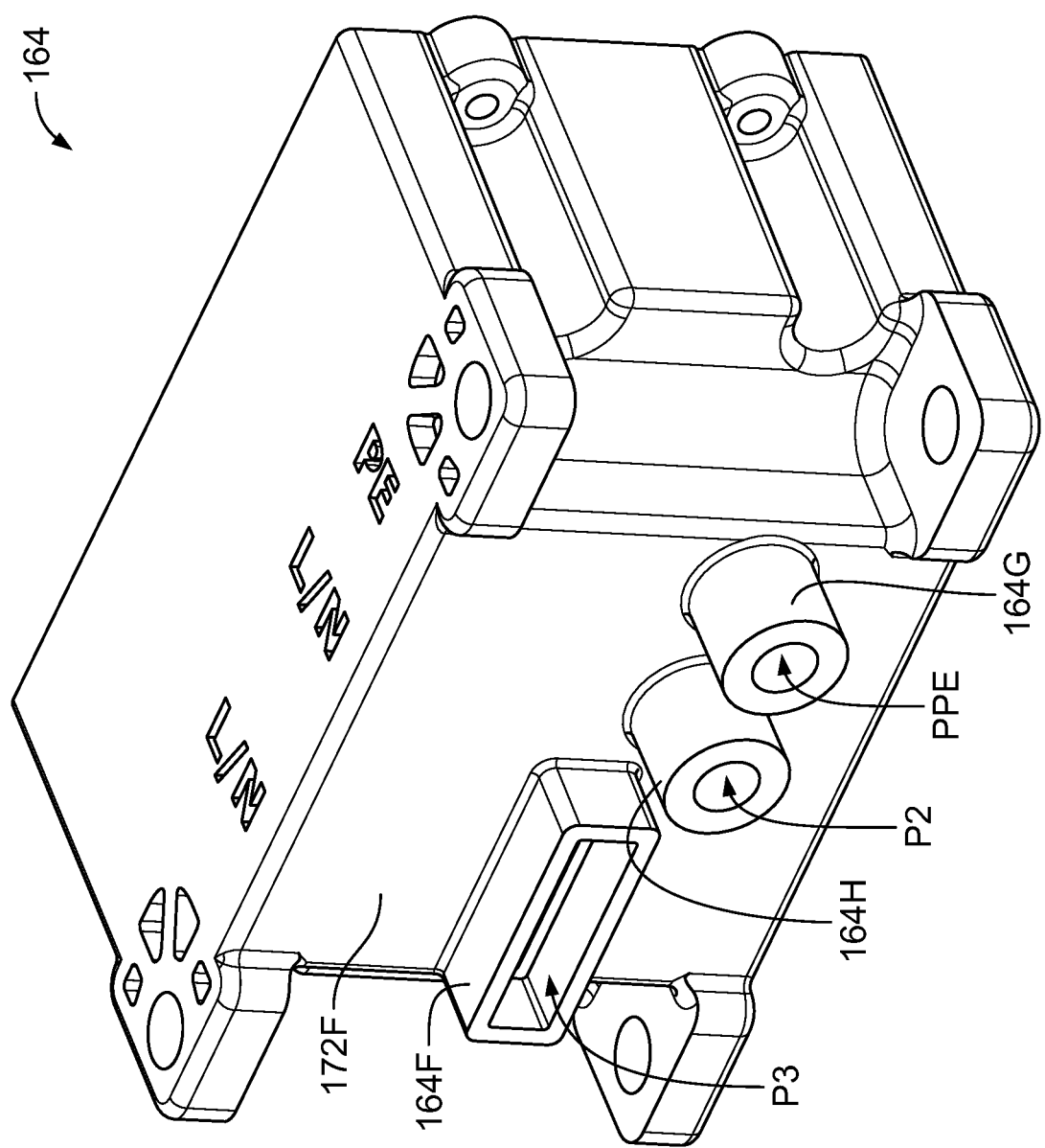
FIG. 9 is an outer, perspective view of the right shell of FIG. 8.
Figure 10:
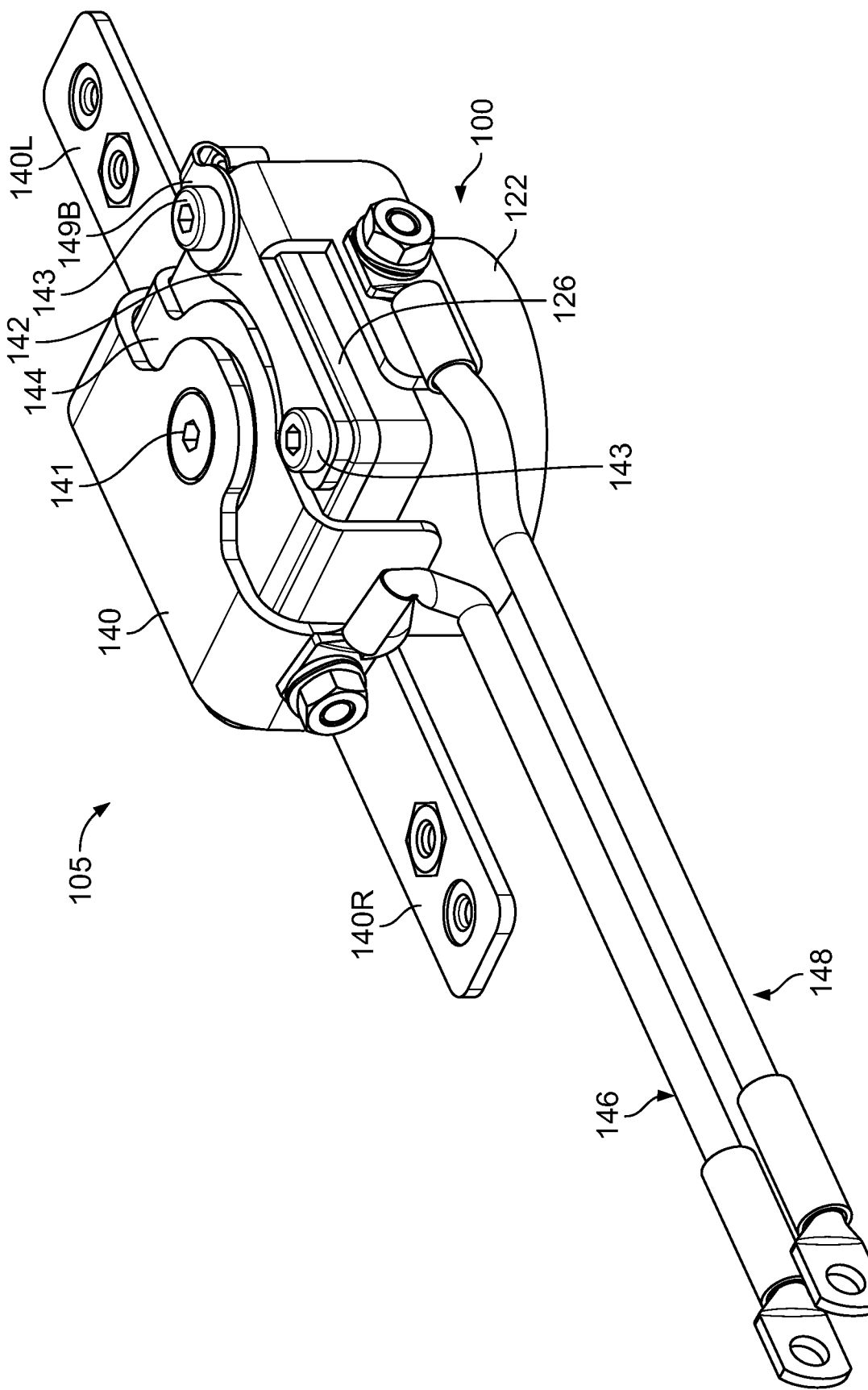
FIG. 10 is a top, perspective view of an electrical subassembly forming a part of the SPD assembly module of FIG. 1.

With reference to FIGS. 2, 9 and 13, the openings PPE and P2 are environmentally sealed about the cables 146A and 148A by polymeric tubes 150. In some embodiments, these openings are sealed water-tight by the tubes 150. The tubes 150 may be formed of any suitable material. In some embodiments, the tubes 150 are formed of an electrically insulating polymeric material. In some embodiments, the tubes 150 are formed of an electrically insulating elastomeric material. In some embodiments, the tubes 150 are formed of an electrically insulating heat shrinkable polymer (e.g., elastomer) that has been heat shrunk about the corresponding cable insulation and termination.

With reference to FIGS. 1-3, the openings P3 and P4 are environmentally sealed about the terminals T3 and T4 (e.g., about the terminal tabs 140L and 140R) by masses of epoxy 152. In some embodiments, the openings P3 and P4 are sealed water-tight by the epoxy 152. The epoxy 152 may be formed of any suitable material.

The SPD assembly module 101 is configured to minimize or prevent movement or vibration of the SPD module 100 relative to the enclosure 160. As shown in FIGS. 3 and 4-9, the SPD module 100 and other components of the electrical subassembly 105 are snugly or tightly captured in the enclosure by abutments between those components and the walls 172A-172F of the shells 162, 164 and the locator features 178 of the shells 162, 164.

Figure 8:
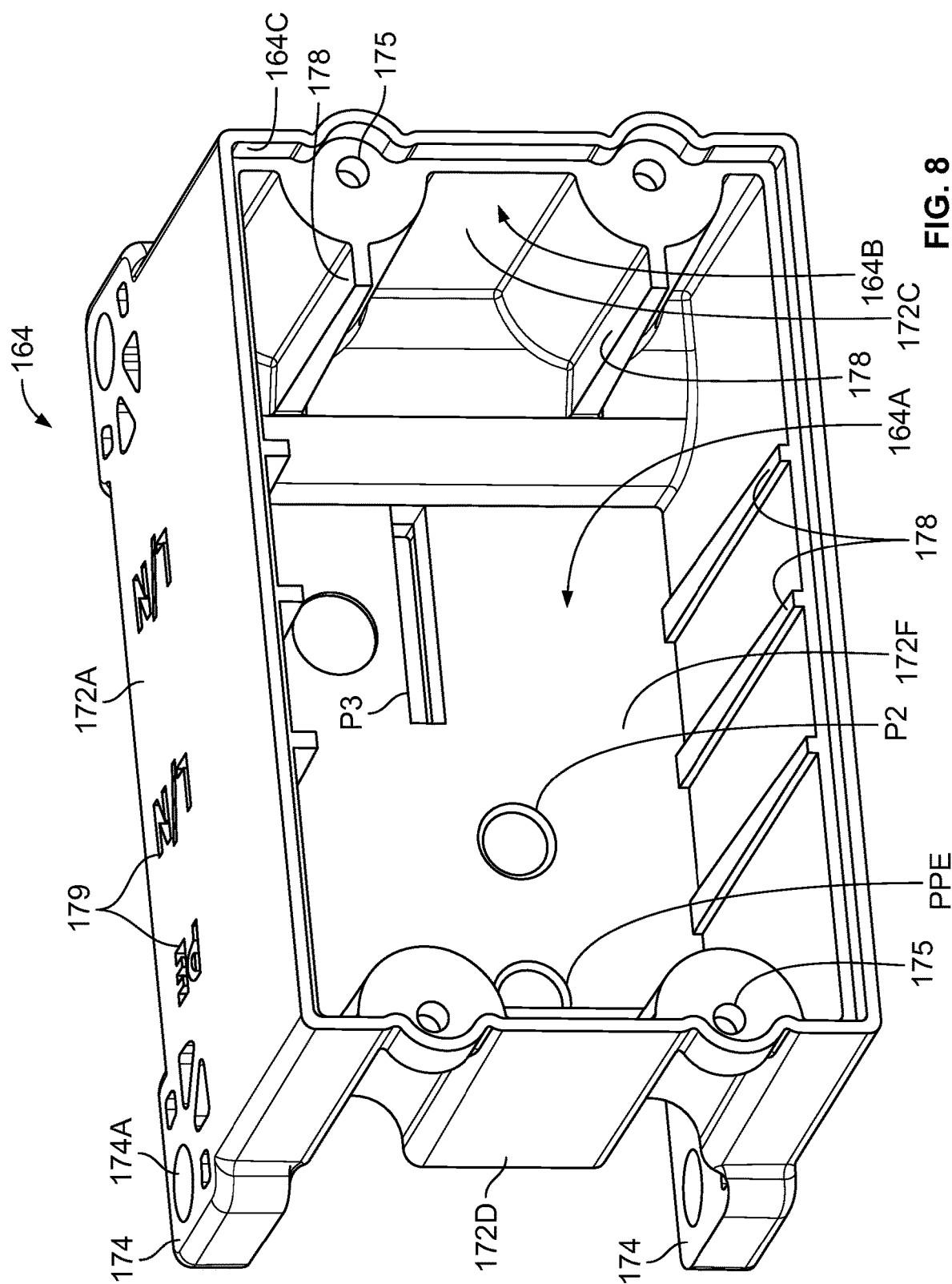
FIG. 8 is an inner, perspective view of a right shell forming a part of the SPD assembly module of FIG. 1.

As shown in FIG. 8, the terminals T3 and T4 are attached to the plastic enclosure 160 through the openings P3, P4 by the epoxy 152, which additionally prevents or inhibits movement or vibration of the SPD module 100 with respect to the enclosure 160.

The PE termination cable 146A and its termination 146C serve as the PE terminal TPE. The L/N termination cable 148 and its termination 148C serve as a first L/N terminal T2. The terminal tab 140R serves as a second L/N terminal T3. The terminal tab 140L serves as a third L/N terminal T4. The terminals TPE, T2, T3, T4 are designated by the indicia 179.

Figure 6:
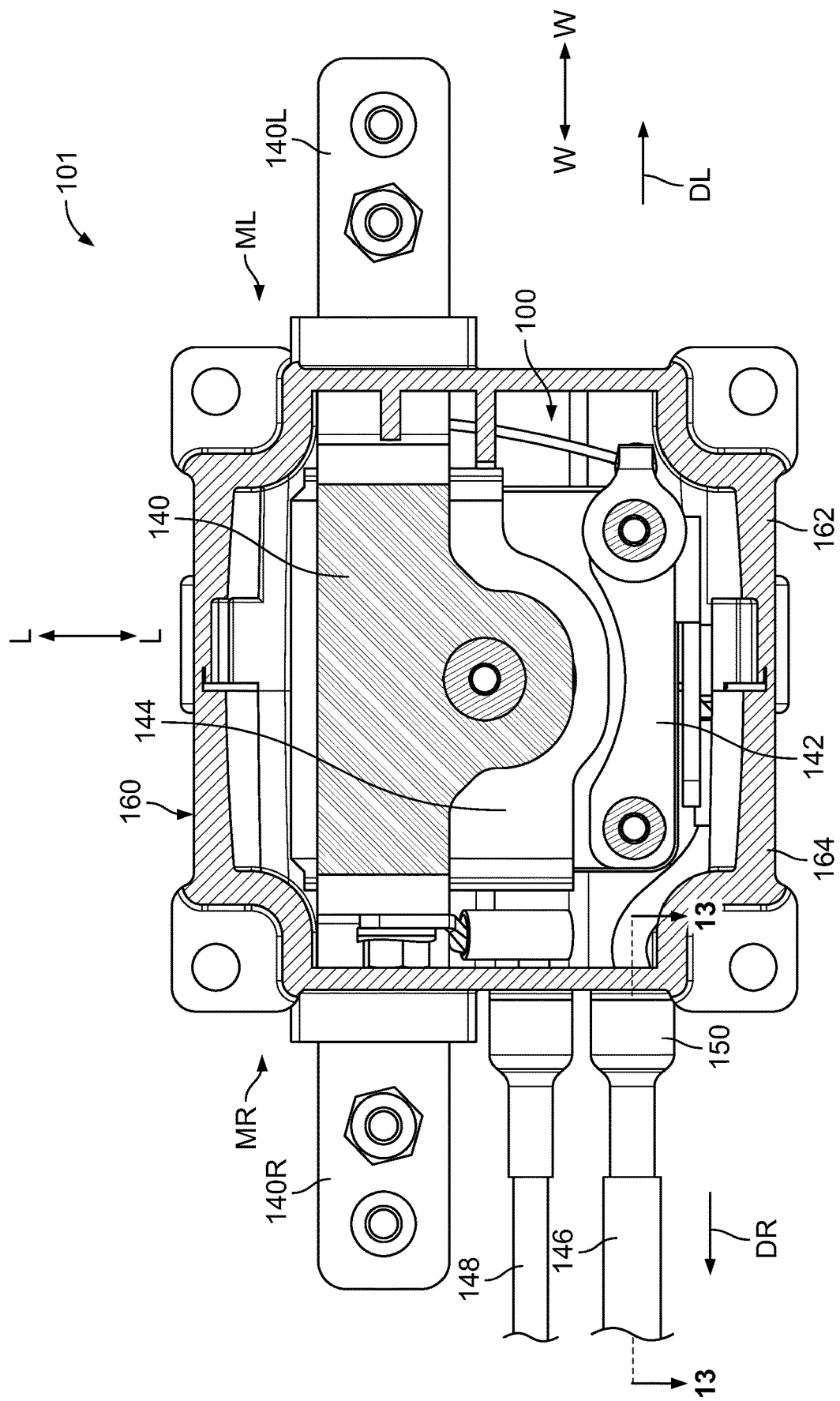
FIG. 6 is a cross-sectional view of the SPD assembly module of FIG. 1 taken along the line 6-6 of FIG. 5.
Figure 7:
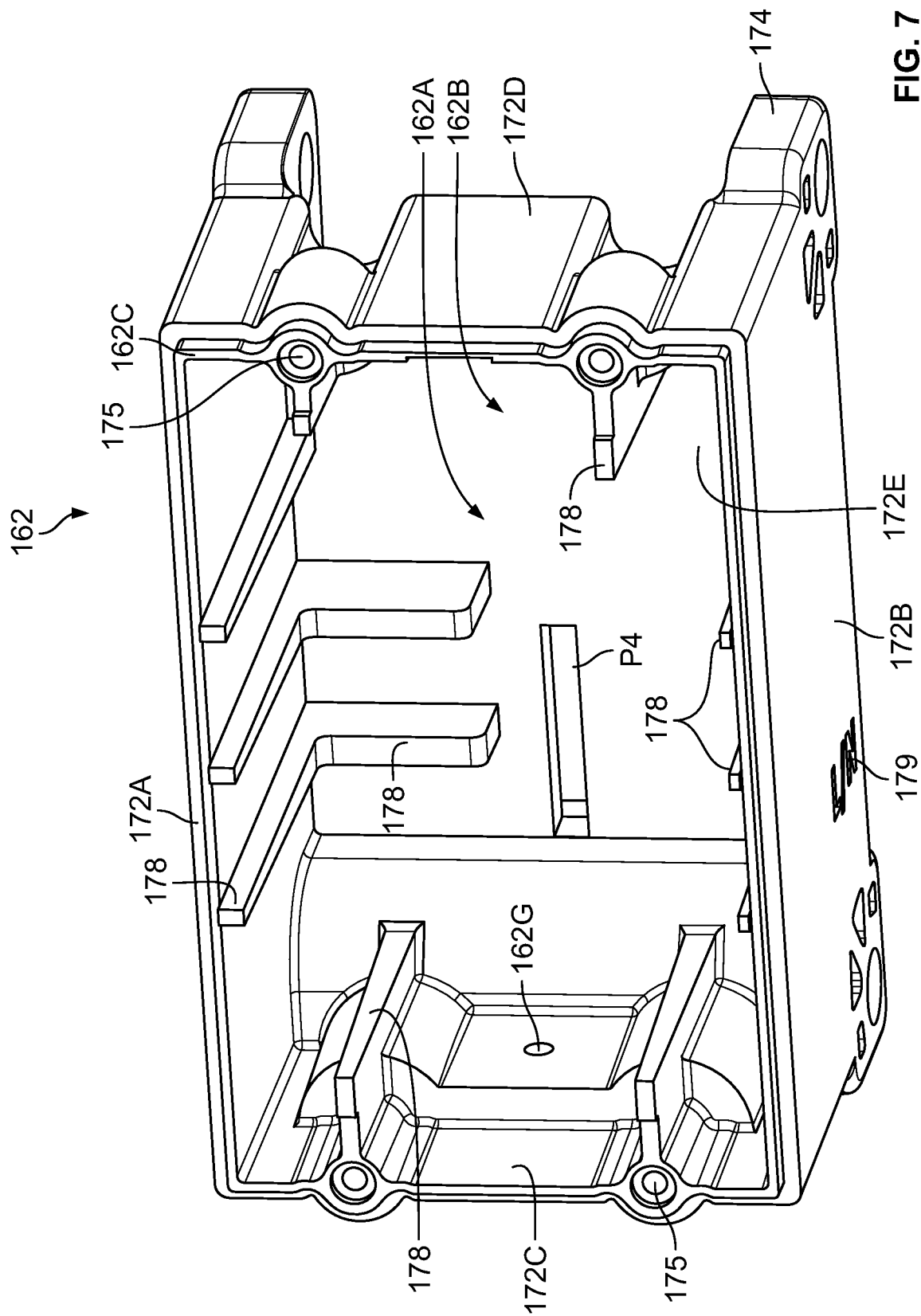
FIG. 7 is an inner, perspective view of a left shell forming a part of the SPD assembly module of FIG. 1.

The PE termination cable 146A, the L/N termination cable 148, and the L/N terminal tab 140R extend outward from the right side MR (FIG. 6) of the enclosure 160 generally in a first direction DR. The terminal tab 140L extends outward from the opposing left side ML of the enclosure 160 generally in a second direction DL. Thus, as shown in FIGS. 6 and 15, the L/N terminals T2, T3 project outwardly from the same side of the enclosure 160, and the L/N terminal T4 projects outwardly from the opposite side of the enclosure 160.

The terminal tabs 140L, 140R are substantially rigidly mounted on the enclosure 160. The L/N termination cable 148A is flexible, so that the terminal T2 is flexibly mounted on the enclosure 160.

The SPD assembly module 101 may be used as follows in accordance with some methods. The SPD assembly module 101 is secured or affixed to a support S (FIGS. 1, 5 and 15-17). In some embodiments, the SPD assembly module 101 is secured to the support S using fasteners 108 (e.g. screws, bolts, nuts, and/or rivets) that are inserted through the openings 174A and into or through the support S as shown in FIG. 5, for example. In some embodiments, the SPD assembly module 101 is secured to the support S using an adhesive 106 that is applied between the top or bottom wall 172A, 172B of the enclosure 160 and the support S to bond the enclosure 160 to the support S (as shown in FIG. 5, for example). In some embodiments, the SPD assembly module 101 is secured to the support S using both the fasteners 108 and the adhesive 106 (FIG. 5).

The adhesive 106 may be any suitable type of adhesive. In some embodiments, the adhesive 106 is a cyanoacrylate-based adhesive. In some embodiments, the adhesive 106 is an epoxy.

The SPD assembly module 101 is also configured to provide alternative options for orienting the SPD assembly module 101 on the support S. The SPD assembly module 101 can be affixed to the support S with either the top wall 172A or the bottom wall 172B facing the support S. The SPD assembly module 101 can be affixed to the support S with the left side ML and the right side MR reversed.

The installer will connect the system PE cable CPE to the PE termination cable 146A to connect the system PE cable CPE to the housing electrode 122 of the SPD module 100. For example, the installer can secure a connector termination 32 of the system PE cable CPE to the connector termination 146C using a fastener (e.g., bolt) as shown in FIG. 15.

The installer can choose from multiple alternative options or configurations for terminating the system line or neutral cable CL (hereinafter, the "system L/N cable CL") to the to the inner electrode 124 of the SPD module 100.

In accordance with a first option, an SPD installation assembly 103A is assembled in a first configuration as shown in FIG. 15. In the first configuration, the installer secures a connector termination 34 of the system L/N cable CL to the connector termination 148C using a fastener (e.g., bolt).

In accordance with a second option, an SPD installation assembly 103B is assembled in a second configuration as shown in FIG. 16. In the second configuration, the installer secures the connector termination 34 of the system L/N cable CL to the right side termination tab 140R using a fastener (e.g., bolt).

In accordance with a third option, an SPD installation assembly 103C is assembled in a third configuration as shown in FIG. 17. In the third configuration, the installer secures the connector termination 34 of the system L/N cable CL to the left side termination tab 140L using a fastener (e.g., bolt).

FIG. 18 illustrates the three alternative electrical circuit configurations formed by the three configurations discussed above. The alternative connections between the line L and the terminals T2, T3, and T4 are illustrated with dashed lines.

It will be appreciated that these three options and configurations provide the installer with the flexibility to terminate the system L/N cable CL on either the left or right side of the enclosure 160.

It will be appreciated that these three options and configurations provide the installer with the flexibility to terminate the system L/N cable CL on the same side or the opposite of the enclosure 160 from the termination of the system PE cable CPE.

It will also be appreciated that these three options and configurations provide the installer with the flexibility to terminate the system L/N cable CL to a flexible terminal (i.e., the terminal T2) or to a rigid terminal (i.e., the terminal T3 or the terminal T4).

In some embodiments, the connection joints between the cable connectors 32, 34 and the terminals 146C, 148C, 140R, 140L are also covered and environmentally sealed to prevent exposure of the connection joints to water or contaminants. These connection joints may also be covered with polymeric tubes constructed as described for the tubes 150, such as heat shrink tube.

The SPD assembly module 101 can provide a number of advantages in use.

The SPD assembly module 101 may be particularly well-suited for use in applications where it is subjected to harsh environmental conditions such as extreme temperatures, moisture, vibration, impacts, and other mechanical forces. The SPD assembly module 101 may be particularly well-suited for use in applications in which mounting flexibility and termination flexibility are desirable or necessary.

The external plastic housing or enclosure 160 provides an environmental barrier surrounding the SPD module 100 and other components and connections of the electrical subassembly 105. As described herein, fluid tight seals are provided about each of the shells interface 167, the ground test port 162G, and the terminal openings PPE, P2, P3, P4. The sealed enclosure 160 can prevent ingress of humidity, other moisture, and contaminants into the enclosure chamber 166. The enclosure 160 and terminal opening seals prevent or reduce the exposure of the SPD module 100 and the connections between the SPD module 100 and the terminal busbar 140, the PE bracket 142, and the connectors in the enclosure chamber 166 to moisture or other contaminants. In this way, the enclosure 160 can prevent or inhibit corrosion of the electrical components enclosed. Also, in this way, the enclosure 160 can prevent the intrusion of moisture that may undesirably short circuit electrical components of the electrical subassembly 105.

According to some embodiments, the enclosure chamber 166 is environmentally sealed in compliance with IP67 rating, version as per the International Electrotechnical Commission (IEC) 60529:1989+AMD1:1999+AMD2: 2013.

The enclosure 160 also provides mechanical protection for the SPD module 100 and the connections.

The SPD housing assembly 121 of the SPD module 100 is robust and protects the internal components and assembly of the SPD module 100 from moisture, contaminants, and mechanical damage. The manner in which the terminals TPE, T2, T3, T4 are connected to the SPD module 100 is also robust to resist dislocations from vibration (including multi-axis vibration and random, sinusoidal or shock vibration stress), thermal expansion, and other forces.

It will be appreciated that the SPD assembly module 101 includes an inner sealed SPD housing assembly 121 containing the varistor 136 and GDT 138, contained within a second, outer enclosure 160. This construction can provide two levels of protection against expulsion of varistor failure byproducts from the SPD module 100 to the environment.

The snug fitment between the enclosure 160 and the electrical subassembly 105 can prevent or inhibit relative movement or vibration between the enclosure 160 and the electrical subassembly 105. This can reduce the risk of damage or deterioration of the internal components and connections of the SPD assembly module 101.

When the outer enclosure 160 and the cable assemblies 146, 148 are formed of materials as described above, the SPD assembly module 101 may be particularly well-suited to withstand high temperatures (e.g., up to 120 deg Celsius) and very low temperatures (e.g., down to −40 deg Celsius) in prolonged service without failure.

As discussed above, the arrangement of the terminals T2, T3, T4 provides the installer or installation designer with bilateral termination options.

As discussed above, the arrangement of the terminals T2, T3, T4 provides the installer or installation designer with the option to choose between connection to a rigid or fixed terminal (i.e., terminal T3 or T4) and connection to a flexible cable (i.e., terminal T2).

As discussed above, the configuration of the enclosure 160 enables the use of alternative mounting techniques, including mounting to a support using fasteners, using adhesive, or using both. The installer can select the preferred mounting method(s) depending on the application.

The sealed ground test contact 149C provides a convenient feature for testing the electrical continuity between the housing electrode 122 of the SPD module 100 and the ground or protective earth PE without breaching the sealed chamber 166. The slidable cover 168 shields the ground test contact from inadvertent contact when not in use.

In the assembled SPD module 100, the large, planar contact surfaces of the components 122A, 124A, 136, 138 can ensure reliable and consistent electrical contact and connection between the components during an overvoltage or surge current event. The head 124A and the end wall 122A are mechanically loaded against these components to ensure firm and uniform engagement between the mating contact surfaces.

The meltable member 132 and the electrodes 122, 124 are relatively constructed and configured to form the fail-safe system 131. The fail-safe system 131 provides a safe failure mode for the SPD module 100.

During use, the varistor wafer 136 or the GDT 138 may be damaged by overheating and may generate arcing inside the SPD housing assembly 121. The SPD housing assembly 121 can contain the damage (e.g., debris, gases and immediate heat) within the SPD module 100, so that the SPD module 100 fails safely. In this way, the SPD module 100 can prevent or reduce any damage to adjacent equipment (e.g., switch gear equipment in the cabinet) and harm to personnel. In this manner, the SPD module 100 can enhance the safety of equipment and personnel.

Additionally, the SPD module 100 provides a fail-safe mechanism in response to end of life mode in the varistor wafer 136. In case of a failure of the varistor wafer 136, a fault current will be conducted between the corresponding line and the neutral line. As is well known, a varistor has an innate nominal clamping voltage VNOM (sometimes referred to as the "breakdown voltage" or simply the "varistor voltage") at which the varistor begins to conduct current. Below the VNOM, the varistor will not pass current. Above the VNOM, the varistor will conduct a current (i.e., a leakage current or a surge current). The VNOM of a varistor is typically specified as the measured voltage across the varistor with a DC current of 1 mA.

As is known, a varistor has three modes of operation. In a first normal mode (discussed above), up to a nominal voltage, the varistor is practically an electrical insulator. In a second normal mode (also discussed above), when the varistor is subjected to an overvoltage, the varistor temporarily and reversibly becomes an electrical conductor during the overvoltage condition and returns to the first mode thereafter. In a third mode (the so-called end of life mode), the varistor is effectively depleted and becomes a permanent, non-reversible electrical conductor.

The varistor also has an innate clamping voltage VC (sometimes referred to as simply the "clamping voltage"). The clamping voltage VC is defined as the maximum voltage measured across the varistor when a specified current is applied to the varistor over time according to a standard protocol.

In the absence of an overvoltage condition, the varistor wafer 136 provides high resistance such that no current flows through the SPD module 100 as it appears electrically as an open circuit. That is, ordinarily the varistor passes no current. In the event of an overcurrent surge event (typically transient; e.g., lightning strike) or an overvoltage condition or event (typically longer in duration than an overcurrent surge event) exceeding VNOM, the resistance of the varistor wafer decreases rapidly, allowing current to flow through the SPD module 100 and create a shunt path for current flow to protect other components of an associated electrical system. Normally, the varistor recovers from these events without significant overheating of the SPD module 100.

Varistors have multiple failure modes. The failure modes include: 1) the varistor fails as a short circuit; and 2) the varistor fails as a linear resistance. The failure of the varistor to a short circuit or to a linear resistance may be caused by the conduction of a single or multiple surge currents of sufficient magnitude and duration or by a single or multiple continuous overvoltage events that will drive a sufficient current through the varistor.

A short circuit failure typically manifests as a localized pinhole or puncture site (herein, "the failure site") extending through the thickness of the varistor. This failure site creates a path for current flow between the two electrodes of a low resistance, but high enough to generate ohmic losses and cause overheating of the device even at low fault currents. Sufficiently large fault current through the varistor can melt the varistor in the region of the failure site and generate an electric arc.

A varistor failure as a linear resistance will cause the conduction of a limited current through the varistor that will result in a buildup of heat. This heat buildup may result in catastrophic thermal runaway and the device temperature may exceed a prescribed maximum temperature. For example, the maximum allowable temperature for the exterior surfaces of the device may be set by code or standard to prevent combustion of adjacent components. If the leakage current is not interrupted at a certain period of time, the overheating will result eventually in the failure of the varistor to a short circuit as defined above.

In some cases, the current through the failed varistor could also be limited by the power system itself (e.g., ground resistance in the system or in photo-voltaic (PV) power source applications where the fault current depends on the power generation capability of the system at the time of the failure) resulting in a progressive build up of temperature, even if the varistor failure is a short circuit. There are cases where there is a limited leakage current flow through the varistor due to extended in time overvoltage conditions due to power system failures, for example. These conditions may lead to temperature build up in the device, such as when the varistor has failed as a linear resistance and could possibly lead to the failure of the varistor either as a linear resistance or as a short circuit as described above.

As discussed above, in some cases the SPD module 100 may assume an "end of life" mode in which the varistor wafer 136 is depleted in full or in part (i.e., in an "end of life" state), leading to an end of life failure. When the varistor reaches its end of life, the SPD module 100 will become substantially a short circuit with a very low but non-zero ohmic resistance. As a result, in an end of life condition, a fault current will continuously flow through the varistor even in the absence of an overvoltage condition. In this case, the meltable member 132 can operate as a fail-safe mechanism that by-passes the failed varistor and creates a permanent low-ohmic short circuit between the terminals of the SPD module 100 in the manner described in U.S. Pat. No. 7,433,169, the disclosure of which is incorporated herein by reference.

The meltable member 132 is adapted and configured to operate as a thermal disconnect to electrically short circuit the current applied to the associated SPD module 100 around the varistor wafer 136 to prevent or reduce the generation of heat in the varistors. In this way, the meltable member 132 can operate as switch to bypass the varistor wafer 136 and prevent overheating and catastrophic failure as described above. As used herein, a fail-safe system is "triggered" upon occurrence of the conditions necessary to cause the fail-safe system to operate as described to short circuit the electrodes 122A, 124A.

When heated to a threshold temperature, the meltable member 132 will flow to bridge and electrically connect the electrodes 122A, 124A. The meltable member 132 thereby redirects the current applied to the SPD module 100 to bypass the varistor wafer 136 so that the current induced heating of the varistor ceases. The meltable member 132 may thereby serve to prevent or inhibit thermal runaway (caused by or generated in the varistor wafer 136) without requiring that the current through the SPD module 100 be interrupted.

Figure 12:
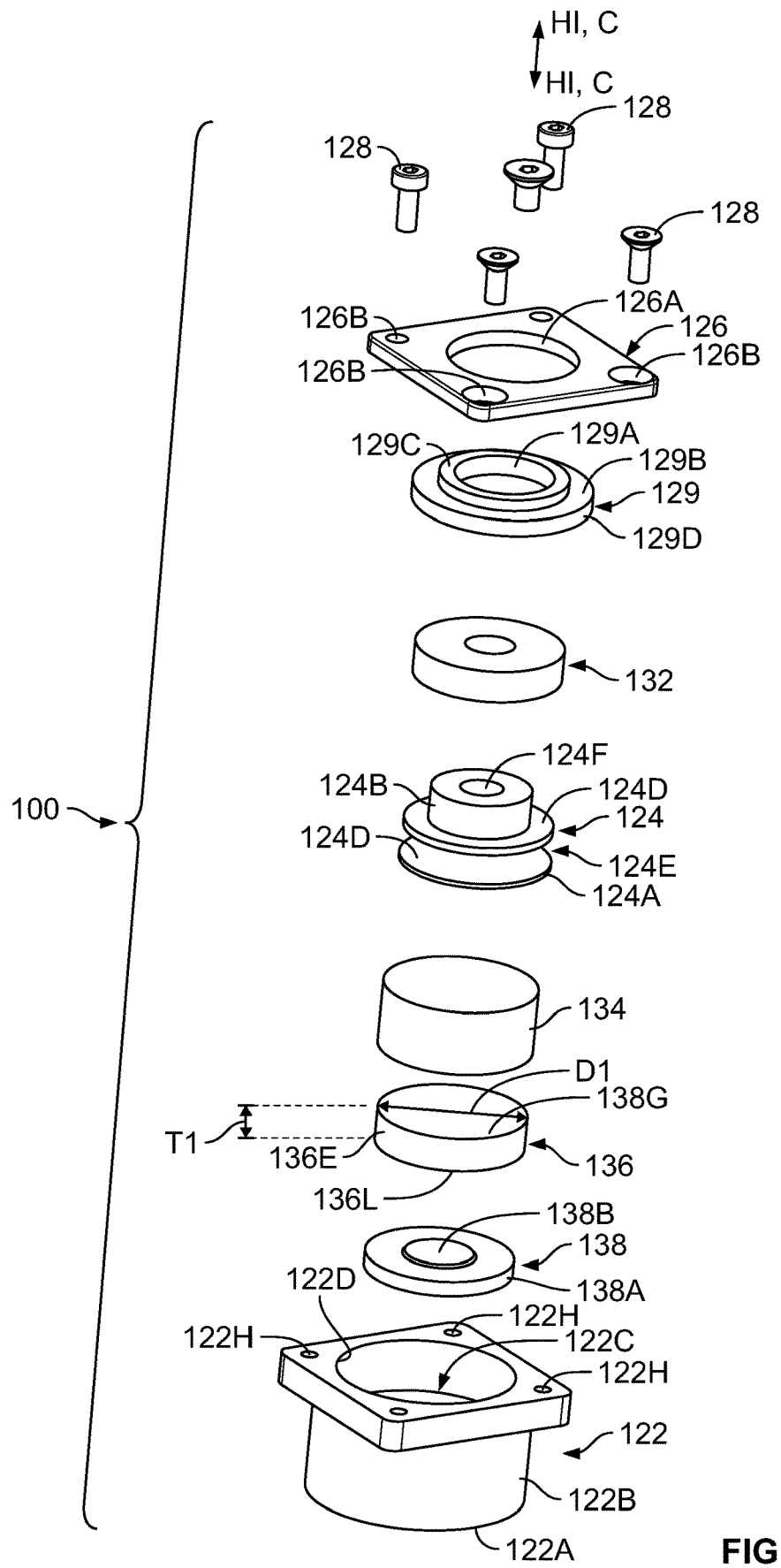
FIG. 12 is an exploded, top, perspective view of an SPD module forming a part of the SPD assembly module of FIG. 1.

More particularly, the meltable member 132 initially has a first configuration as shown in FIGS. 4, 5 and 12 such that it does not electrically couple the electrode 124 and the housing 122 except through the head 124A. Upon the occurrence of a heat buildup event, the electrode 124 is thereby heated. The meltable member 132 is also heated directly and/or by the electrode 124. During normal operation, the temperature in the meltable member 132 remains below its melting point so that the meltable member 132 remains in solid form. However, when the temperature of the meltable member 132 exceeds its melting point, the meltable member 132 melts (in full or in part) and flows by force of gravity into a second configuration different from the first configuration. The meltable member 132 bridges or short circuits the electrode 124 to the housing 122 to bypass the varistor wafer 136. That is, a new direct flow path or paths are provided from the surface of the electrode 124 to the surface of the housing sidewall 122B through the meltable member 132. According to some embodiments, at least some of these flow paths do not include the varistor wafer 136.

According to some embodiments, the SPD module 100 is adapted such that when the meltable member 132 is triggered to short circuit the SPD module 100, the conductivity of the SPD module 100 is at least as great as the conductivity of the feed and exit cables connected to the device.

Electrical protection devices according to embodiments of the present invention may provide a number of advantages in addition to those mentioned above. The devices may be formed so to have a relatively compact form factor. The devices may be retrofittable for installation in place of similar type surge protective devices not having circuits as described herein. In particular, the present devices may have the same length dimension as such previous devices.

According to some embodiments, the biased electrodes (e.g., the electrodes 122 and 124) apply a load to the varistors along the axis C-C in the range of from 2000 lbf and 26000 lbf depending on its surface area.

In alternative embodiments (not shown), the SPD module 100 may be modified to use biasing or loading means such as metal spring washers and separate sealing means such as elastomeric O-rings.

According to some embodiments, the combined thermal mass of the housing (e.g., the housing 122) and the electrode (e.g., the electrode 124) is substantially greater than the thermal mass of each of the varistors captured therebetween. The greater the ratio between the thermal mass of the housing and electrodes and the thermal mass of the varistors, the better the varistors will be preserved during exposure to surge currents and TOV events and therefore the longer the lifetime of the SPD. As used herein, the term "thermal mass" means the product of the specific heat of the material or materials of the object multiplied by the mass or masses of the material or materials of the object. That is, the thermal mass is the quantity of energy required to raise one gram of the material or materials of the object by one degree centigrade times the mass or masses of the material or materials in the object. According to some embodiments, the thermal mass of at least one of the electrode head and the electrode wall is substantially greater than the thermal mass of the varistor. According to some embodiments, the thermal mass of at least one of the electrode head and the electrode wall is at least two times the thermal mass of the varistor, and, according to some embodiments, at least ten times as great. According to some embodiments, the combined thermal masses of the head and the electrode wall are substantially greater than the thermal mass of the varistor, according to some embodiments at least two times the thermal mass of the varistor and, according to some embodiments, at least ten times as great.

While the SPD module 100 has been shown and described including a varistor wafer 136 and a GDT 138, in other embodiments the GDT 138 may be omitted.

In some embodiments, the ground testing terminal assembly 149 and the test cover 168 may be omitted.

In some embodiments, the flexible PE cable assembly 146 and/or the flexible L/N cable assembly 148, may be replaced with a rigid busbar including terminal tabs corresponding to the terminal tabs 140R, 140L and projecting through and out of the enclosure 160 in the same manner as the terminal tabs 140R, 140L.

Many alterations and modifications may be made by those having ordinary skill in the art, given the benefit of present disclosure, without departing from the spirit and scope of the invention. Therefore, it must be understood that the illustrated embodiments have been set forth only for the purposes of example, and that it should not be taken as limiting the invention as defined by the following claims. The following claims, therefore, are to be read to include not only the combination of elements which are literally set forth but all equivalent elements for performing substantially the same function in substantially the same way to obtain substantially the same result. The claims are thus to be understood to include what is specifically illustrated and described above, what is conceptually equivalent, and also what incorporates the essential idea of the invention.

What is claimed is:

1. A surge protective device (SPD) assembly module comprising:
    a polymeric outer enclosure defining an enclosed, environmentally sealed enclosure chamber;
    an SPD module disposed in the enclosure chamber, wherein the SPD module defines an environmentally sealed SPD chamber and includes:
        first and second electrically conductive electrode members; and
        a varistor member formed of a varistor material and electrically connected between the first and second electrode members;
        wherein the varistor member is disposed in the SPD chamber between the first and second electrode members;
    a first terminal electrically connected to the first electrode member and extending out from the outer enclosure; and
    a second terminal electrically connected to the second electrode member and extending out from the outer enclosure;
    wherein the outer enclosure is configured to mount the SPD assembly module on a support in each of a first orientation and a second orientation inverted from the first orientation; and
    wherein at least one of the first and second terminals includes a terminal structure rigidly mounted on the outer enclosure and projecting outwardly from a side of the outer enclosure.

2. The SPD assembly module of claim 1 wherein the SPD module further includes a gas discharge tube (GDT) disposed in the SPD chamber and connected in electrical series with the varistor member between the first and second electrode members.

3. The SPD assembly module of claim 1 wherein:
    one of the first and second electrode members is a housing electrode defining an SPD cavity;
    the SPD cavity forms at least a portion of the SPD chamber; and
    the other of the first and second electrode members is disposed in the SPD cavity.

4. The SPD assembly module of claim 3 wherein the housing electrode includes a metal end wall and an integral metal sidewall collectively defining the SPD cavity.

5. The SPD assembly module of claim 1 wherein the SPD module includes a biasing device applying an axially compressive load to the varistor member.

6. The SPD assembly module of claim 1 including an electrically conductive meltable member, wherein the meltable member is responsive to heat in the overvoltage protection device to melt and form an electrical short circuit path between the first and second electrode members.

7. The SPD assembly module of claim 1 wherein the varistor member comprises a varistor wafer.

8. The SPD assembly module of claim 1 including a third terminal electrically connected to the second electrode member and extending out from the outer enclosure.

9. The SPD assembly module of claim 8 wherein:
the outer enclosure has opposed first and second sides;
the second terminal projects outwardly from the first side of the outer enclosure; and
the third terminal projects outwardly from the second side of the outer enclosure.

10. The SPD assembly module of claim 9 wherein:
the second terminal includes a first terminal structure rigidly mounted on the outer enclosure and projecting outwardly from the first side of the outer enclosure; and
the third terminal includes a second terminal structure rigidly mounted on the outer enclosure and projecting outwardly from the second side of the outer enclosure.

11. The SPD assembly module of claim 8 wherein:
the third terminal includes a first terminal structure connected to the outer enclosure by a flexible cable extending outwardly from the outer enclosure; and
the second terminal includes a second terminal structure rigidly mounted on the outer enclosure and projecting outwardly from the outer enclosure.

12. The SPD assembly module of claim 1 wherein at least one of the first and second terminals includes a terminal structure connected to the SPD module by a flexible cable extending outwardly from the outer enclosure.

13. The SPD assembly module of claim 12 wherein:
the flexible cable extends through an opening in the outer enclosure; and
the SPD assembly module includes a heat shrink tube forming a seal between the flexible cable and the opening.

14. The SPD assembly module of claim 1 wherein the outer enclosure fits snugly about the SPD module to inhibit or prevent relative movement between the SPD module and the outer enclosure.

15. The SPD assembly module of claim 1 wherein the enclosed chamber is environmentally sealed in compliance with IP67 rating as per the International Electrotechnical Commission (IEC) 60529:1989+AMD1:1999+AMD2:2013.

16. The SPD assembly module of claim 1 wherein:
the outer enclosure includes first and second shells each defining a respective shell cavity; and
the first and second shells are secured to one another and the respective shell cavities collectively form the enclosure chamber.

17. The SPD assembly module of claim 16 including fasteners securing the first and second shells to one another.

18. The SPD assembly module of claim 1 wherein:
the outer enclosure includes fastener holes; and
the SPD assembly module is configured to be mounted on a support using fasteners inserted through the fastener holes.

19. The SPD assembly module of claim 1 including an adhesive for bonding the outer enclosure to a support.

20. The SPD assembly module of claim 19 wherein the adhesive includes an adhesive selected from the group consisting of epoxy, and cyanoacrylate-based adhesive.

21. The SPD assembly module of claim 1 wherein:
the SPD assembly module includes an integral electrical ground testing terminal electrically connected to the first electrode member;
the electrical ground testing terminal is mounted in an opening in the outer enclosure and the opening is environmentally sealed; and
the electrical ground testing terminal is accessible from external to the outer enclosure.

22. The SPD assembly module of claim 1 wherein the outer enclosure is formed of a material including a polymer selected from the group consisting of polysulphone (PSU), polyphenylsulphone (PPSU), and polyethersulphone (PESU).

23. A surge protective device (SPD) assembly module comprising:
a polymeric outer enclosure defining an enclosed, environmentally sealed enclosure chamber;
an SPD module disposed in the enclosure chamber, wherein the SPD module defines an environmentally sealed SPD chamber and includes:
first and second electrically conductive electrode members; and
a varistor member formed of a varistor material and electrically connected between the first and second electrode members;
wherein the varistor member is disposed in the SPD chamber between the first and second electrode members;
a first terminal electrically connected to the first electrode member and extending out from the outer enclosure; and
a second terminal electrically connected to the second electrode member and extending out from the outer enclosure;
wherein:
the SPD assembly module includes a third terminal electrically connected to the second electrode member and extending out from the outer enclosure;
the outer enclosure has opposed first and second sides;
the second terminal projects outwardly from the first side of the outer enclosure;
the third terminal projects outwardly from the second side of the outer enclosure;
the second terminal includes a first terminal structure rigidly mounted on the outer enclosure and projecting outwardly from the first side of the outer enclosure; and
the third terminal includes a second terminal structure rigidly mounted on the outer enclosure and projecting outwardly from the second side of the outer enclosure.

24. A surge protective device (SPD) assembly module comprising:
a polymeric outer enclosure defining an enclosed, environmentally sealed enclosure chamber;
an SPD module disposed in the enclosure chamber, wherein the SPD module defines an environmentally sealed SPD chamber and includes:
first and second electrically conductive electrode members; and
a varistor member formed of a varistor material and electrically connected between the first and second electrode members;
wherein the varistor member is disposed in the SPD chamber between the first and second electrode members;

a first terminal electrically connected to the first electrode member and extending out from the outer enclosure; and a second terminal electrically connected to the second electrode member and extending out from the outer enclosure;

wherein:

the SPD assembly module includes a third terminal electrically connected to the second electrode member and extending out from the outer enclosure;

the second terminal includes a first terminal structure connected to the outer enclosure by a flexible cable extending outwardly from the outer enclosure; and the third terminal includes a second terminal structure rigidly mounted on the outer enclosure and projecting outwardly from the outer enclosure.

25. The SPD assembly module of claim 24 wherein:

the outer enclosure has opposed first and second sides;

the second terminal projects outwardly from the first side of the outer enclosure; and the third terminal also projects outwardly from the first side of the outer enclosure.

26. The SPD assembly module of claim 25 including a fourth terminal electrically connected to the second electrode member, wherein the fourth terminal includes a second terminal structure rigidly mounted on the outer enclosure and projecting outwardly from the second side of the outer enclosure.

27. A surge protective device (SPD) assembly module comprising:

a polymeric outer enclosure defining an enclosed, environmentally sealed enclosure chamber;

an SPD module disposed in the enclosure chamber, wherein the SPD module defines an environmentally sealed SPD chamber and includes:

first and second electrically conductive electrode members; and a varistor member formed of a varistor material and electrically connected between the first and second electrode members;

wherein the varistor member is disposed in the SPD chamber between the first and second electrode members;

a first terminal electrically connected to the first electrode member and extending out from the outer enclosure; and a second terminal electrically connected to the second electrode member and extending out from the outer enclosure;

wherein:

at least one of the first and second terminals includes a terminal structure connected to the SPD module by a flexible cable extending outwardly from the outer enclosure;

the flexible cable extends through an opening in the outer enclosure; and the SPD assembly module includes a heat shrink tube forming a seal between the flexible cable and the opening.

28. A surge protective device (SPD) assembly module comprising:

a polymeric outer enclosure defining an enclosed, environmentally sealed enclosure chamber;

an SPD module disposed in the enclosure chamber, wherein the SPD module defines an environmentally sealed SPD chamber and includes:

first and second electrically conductive electrode members; and a varistor member formed of a varistor material and electrically connected between the first and second electrode members;

wherein the varistor member is disposed in the SPD chamber between the first and second electrode members;

a first terminal electrically connected to the first electrode member and extending out from the outer enclosure; and a second terminal electrically connected to the second electrode member and extending out from the outer enclosure;

wherein:

the SPD assembly module includes an integral electrical ground testing terminal electrically connected to the first electrode member;

the electrical ground testing terminal is mounted in an opening in the outer enclosure and the opening is environmentally sealed; and the electrical ground testing terminal is accessible from external to the outer enclosure.

29. The SPD assembly module of claim 28 including a cover over the electrical ground testing terminal, wherein the cover is selectively movable away from the electrical ground testing terminal to provide access to the electrical ground testing terminal.

* * * * *